(12) United States Patent  
Sirinorakul

(10) Patent No.: US 8,461,694 B1  
(45) Date of Patent: Jun. 11, 2013

(54) LEAD FRAME BALL GRID ARRAY WITH TRACES UNDER DIE HAVING INTERLOCKING FEATURES

(71) Applicant: UTAC Thai Limited, Bangkok (TH)

(72) Inventor: Saravuth Sirinorakul, Bangkok (TH)

(73) Assignee: UTAC Thai Limited, Bangna, Bangkok (TH)

( * ) Notice: Subject to any disclaimer, the term of this patent is extended or adjusted under 35 U.S.C. 154(b) by 0 days.

(21) Appl. No.: 13/715,771

(22) Filed: Dec. 14, 2012

Related U.S. Application Data

(63) Continuation-in-part of application No. 13/080,512, filed on Apr. 5, 2011, which is a continuation-in-part of application No. 13/040,112, filed on Mar. 3, 2011, and a continuation-in-part of application No. 11/731,522, filed on Mar. 30, 2007, now Pat. No. 8,310,060.

(60) Provisional application No. 61/455,881, filed on Oct. 27, 2010, provisional application No. 60/795,929, filed on Apr. 28, 2006, provisional application No. 61/321,060, filed on Apr. 5, 2010.

(51) Int. Cl.  
*H01L 23/48* (2006.01)

(52) U.S. Cl.  
USPC .................... 257/777; 257/784; 257/E23.037

(58) Field of Classification Search  
USPC .................................. 257/777, 784, E23.037  
See application file for complete search history.

(56) References Cited

U.S. PATENT DOCUMENTS

| | | |
|---|---|---|
| 3,611,061 A | 10/1971 | Segerson |
| 4,411,719 A | 10/1983 | Lindberg |
| 4,501,960 A | 2/1985 | Jouvet et al. |
| 4,801,561 A | 1/1989 | Sankhagowit |
| 4,855,672 A | 8/1989 | Shreeve |
| 5,247,248 A | 9/1993 | Fukunaga |
| 5,248,075 A | 9/1993 | Young et al. |
| 5,396,185 A | 3/1995 | Honma et al. |
| 5,397,921 A | 3/1995 | Karnezos |
| 5,479,105 A | 12/1995 | Kim et al. |
| 5,535,101 A | 7/1996 | Miles et al. |
| 5,596,231 A | 1/1997 | Combs |
| 5,764,485 A * | 6/1998 | Lebaschi ....................... 361/774 |
| 5,843,808 A | 12/1998 | Karnezos |
| 5,976,912 A | 11/1999 | Fukutomi et al. |
| 5,990,692 A | 11/1999 | Jeong et al. |
| 6,072,239 A | 6/2000 | Yoneda et al. |
| 6,111,324 A | 8/2000 | Sheppard et al. |
| 6,159,770 A | 12/2000 | Tetaka et al. |
| 6,229,200 B1 | 5/2001 | Mclellan et al. |

(Continued)

OTHER PUBLICATIONS

Michael Quirk and Julian Serda, Semiconductor Manufacturing Technology, Pearson Education International, Pearson Prentice Hall, 2001, pp. 587-588.

*Primary Examiner* — Lex Malsawma  
(74) *Attorney, Agent, or Firm* — Haverstock & Owens, LLP

(57) ABSTRACT

A package includes a first plated area, a second plated area, a die attached to the first plated area, and a bond coupling the die to the second plated area. The package further includes a molding encapsulating the die, the bond, and the top surfaces of the first and second plated areas, such that the bottom surfaces of the first and second plated areas are exposed exterior to the package. Additional embodiments include a method of making the package.

13 Claims, 40 Drawing Sheets

U.S. PATENT DOCUMENTS

| | | | |
|---|---|---|---|
| 6,232,650 B1 * | 5/2001 | Fujisawa et al. | 257/666 |
| 6,242,281 B1 | 6/2001 | Mclellan et al. | |
| 6,284,569 B1 | 9/2001 | Sheppard et al. | |
| 6,285,075 B1 | 9/2001 | Combs et al. | |
| 6,294,100 B1 | 9/2001 | Fan et al. | |
| 6,304,000 B1 | 10/2001 | Isshiki et al. | |
| 6,324,754 B1 * | 12/2001 | DiStefano et al. | 29/840 |
| 6,326,678 B1 | 12/2001 | Karnezos et al. | |
| 6,329,605 B1 * | 12/2001 | Beroz et al. | 174/256 |
| 6,329,711 B1 | 12/2001 | Kawahara et al. | |
| 6,353,263 B1 | 3/2002 | Dotta et al. | |
| 6,376,921 B1 | 4/2002 | Yoneda et al. | |
| 6,392,427 B1 | 5/2002 | Yang | |
| 6,414,385 B1 | 7/2002 | Huang et al. | |
| 6,429,048 B1 | 8/2002 | McLellan et al. | |
| 6,451,709 B1 | 9/2002 | Hembree | |
| 6,452,255 B1 * | 9/2002 | Bayan et al. | 257/666 |
| 6,455,348 B1 | 9/2002 | Yamaguchi | |
| 6,472,608 B2 * | 10/2002 | Nakayama | 174/255 |
| 6,489,218 B1 | 12/2002 | Kim et al. | |
| 6,498,099 B1 | 12/2002 | McLellan et al. | |
| 6,507,116 B1 | 1/2003 | Caletka et al. | |
| 6,545,332 B2 | 4/2003 | Huang | |
| 6,545,347 B2 | 4/2003 | McClellan | |
| 6,552,417 B2 | 4/2003 | Combs | |
| 6,552,423 B2 | 4/2003 | Song et al. | |
| 6,566,740 B2 | 5/2003 | Yasunaga et al. | |
| 6,573,121 B2 | 6/2003 | Yoneda et al. | |
| 6,585,905 B1 | 7/2003 | Fan et al. | |
| 6,586,834 B1 | 7/2003 | Sze et al. | |
| 6,635,957 B2 | 10/2003 | Kwan et al. | |
| 6,667,191 B1 | 12/2003 | McLellan et al. | |
| 6,686,667 B2 | 2/2004 | Chen et al. | |
| 6,703,696 B2 | 3/2004 | Ikenaga et al. | |
| 6,724,071 B2 | 4/2004 | Combs | |
| 6,734,044 B1 | 5/2004 | Fan et al. | |
| 6,734,552 B2 | 5/2004 | Combs et al. | |
| 6,737,755 B1 | 5/2004 | McLellan et al. | |
| 6,762,503 B2 * | 7/2004 | Lee | 257/781 |
| 6,764,880 B2 | 7/2004 | Wu et al. | |
| 6,770,959 B2 | 8/2004 | Huang et al. | |
| 6,781,242 B1 | 8/2004 | Fan et al. | |
| 6,800,948 B1 | 10/2004 | Fan et al. | |
| 6,812,552 B2 | 11/2004 | Islam et al. | |
| 6,818,472 B1 | 11/2004 | Fan et al. | |
| 6,818,978 B1 | 11/2004 | Fan et al. | |
| 6,818,980 B1 | 11/2004 | Pedron, Jr. | |
| 6,841,859 B1 | 1/2005 | Thamby et al. | |
| 6,876,066 B2 | 4/2005 | Fee et al. | |
| 6,897,428 B2 | 5/2005 | Minamio et al. | |
| 6,933,176 B1 | 8/2005 | Kirloskar et al. | |
| 6,933,594 B2 | 8/2005 | McLellan et al. | |
| 6,940,154 B2 | 9/2005 | Pedron et al. | |
| 6,946,324 B1 | 9/2005 | McLellan et al. | |
| 6,964,918 B1 | 11/2005 | Fan et al. | |
| 6,967,126 B2 | 11/2005 | Lee et al. | |
| 6,979,594 B1 | 12/2005 | Fan et al. | |
| 6,982,491 B1 | 1/2006 | Fan et al. | |
| 6,984,785 B1 | 1/2006 | Diao et al. | |
| 6,989,294 B1 | 1/2006 | McLellan et al. | |
| 6,995,460 B1 | 2/2006 | McLellan et al. | |
| 7,008,825 B1 | 3/2006 | Bancod et al. | |
| 7,009,286 B1 | 3/2006 | Kirloskar et al. | |
| 7,026,192 B2 | 4/2006 | Minamio et al. | |
| 7,049,177 B1 | 5/2006 | Fan et al. | |
| 7,060,535 B1 | 6/2006 | Sirinorakul et al. | |
| 7,071,545 B1 | 7/2006 | Patel et al. | |
| 7,091,581 B1 | 8/2006 | McLellan et al. | |
| 7,095,096 B1 | 8/2006 | Mostafazadeh | |
| 7,101,210 B2 | 9/2006 | Lin et al. | |
| 7,102,210 B2 | 9/2006 | Ichikawa | |
| 7,187,072 B2 | 3/2007 | Fukutomi et al. | |
| 7,205,178 B2 | 4/2007 | Shiu et al. | |
| 7,224,048 B1 | 5/2007 | McLellan et al. | |
| 7,247,526 B1 | 7/2007 | Fan et al. | |
| 7,274,088 B2 | 9/2007 | Wu et al. | |
| 7,314,820 B2 | 1/2008 | Lin et al. | |
| 7,315,080 B1 | 1/2008 | Fan et al. | |
| 7,342,305 B1 | 3/2008 | Diao et al. | |
| 7,344,920 B1 | 3/2008 | Kirloskar et al. | |
| 7,348,663 B1 | 3/2008 | Kirloskar et al. | |
| 7,358,119 B2 | 4/2008 | McLellan et al. | |
| 7,371,610 B1 | 5/2008 | Fan et al. | |
| 7,372,151 B1 | 5/2008 | Fan et al. | |
| 7,381,588 B1 | 6/2008 | Patel et al. | |
| 7,399,658 B2 | 7/2008 | Shim et al. | |
| 7,408,251 B2 | 8/2008 | Hata et al. | |
| 7,410,834 B2 * | 8/2008 | Fukaya et al. | 438/123 |
| 7,411,289 B1 | 8/2008 | McLellan et al. | |
| 7,449,771 B1 | 11/2008 | Fan et al. | |
| 7,482,690 B1 | 1/2009 | Fan et al. | |
| 7,595,225 B1 | 9/2009 | Fan et al. | |
| 7,608,482 B1 * | 10/2009 | Bayan | 438/112 |
| 7,714,418 B2 | 5/2010 | Lim et al. | |
| 7,790,500 B2 * | 9/2010 | Ramos et al. | 438/106 |
| 2002/0074672 A1 | 6/2002 | Huang et al. | |
| 2002/0160552 A1 | 10/2002 | Minamio et al. | |
| 2003/0006055 A1 * | 1/2003 | Chien-Hung et al. | 174/52.1 |
| 2003/0045032 A1 | 3/2003 | Abe | |
| 2003/0071333 A1 | 4/2003 | Matsuzawa | |
| 2003/0143776 A1 | 7/2003 | Pedron, Jr. et al. | |
| 2003/0178719 A1 | 9/2003 | Combs et al. | |
| 2003/0201520 A1 | 10/2003 | Knapp et al. | |
| 2003/0207498 A1 | 11/2003 | Islam et al. | |
| 2004/0014257 A1 | 1/2004 | Kim et al. | |
| 2004/0046237 A1 | 3/2004 | Abe et al. | |
| 2004/0046241 A1 | 3/2004 | Combs et al. | |
| 2004/0080025 A1 | 4/2004 | Kasahara et al. | |
| 2004/0110319 A1 | 6/2004 | Fukutomi et al. | |
| 2005/0003586 A1 | 1/2005 | Shimanuki et al. | |
| 2005/0077613 A1 | 4/2005 | McLellan et al. | |
| 2006/0192295 A1 | 8/2006 | Lee et al. | |
| 2006/0223229 A1 | 10/2006 | Kirloskar et al. | |
| 2006/0223237 A1 | 10/2006 | Combs et al. | |
| 2006/0273433 A1 | 12/2006 | Itou et al. | |
| 2007/0001278 A1 | 1/2007 | Jeon et al. | |
| 2007/0200210 A1 | 8/2007 | Zhao et al. | |
| 2007/0235217 A1 | 10/2007 | Workman | |
| 2008/0048308 A1 | 2/2008 | Lam | |
| 2008/0150094 A1 | 6/2008 | Anderson | |
| 2008/0258278 A1 * | 10/2008 | Ramos et al. | 257/676 |
| 2010/0224971 A1 * | 9/2010 | Li | 257/676 |
| 2011/0147931 A1 | 6/2011 | Nondhasitthichai et al. | |

* cited by examiner

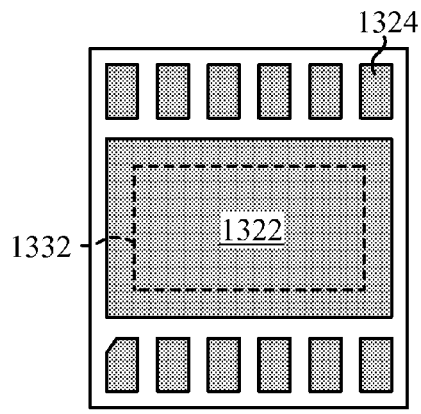 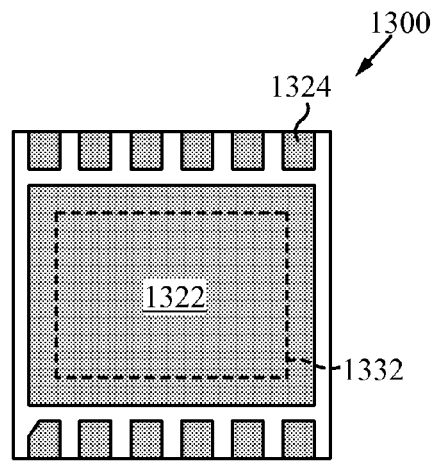
Fig. 13        Fig. 13A
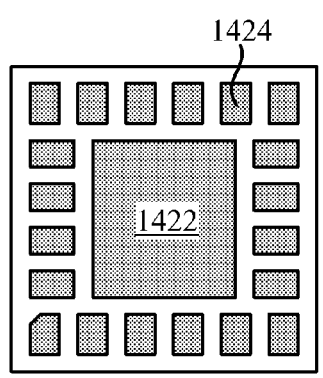 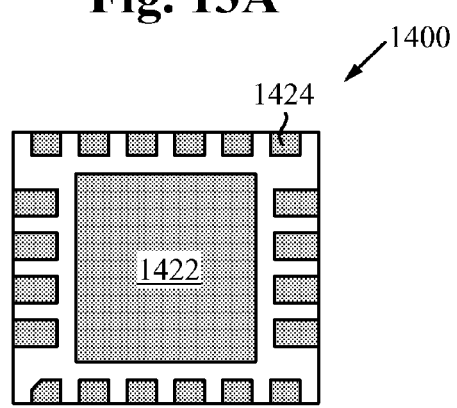
Fig. 14        Fig. 14A
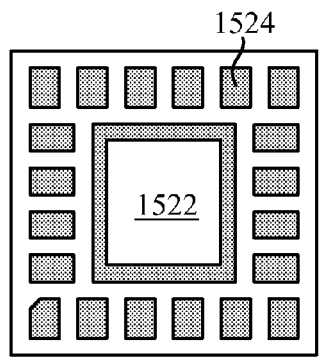 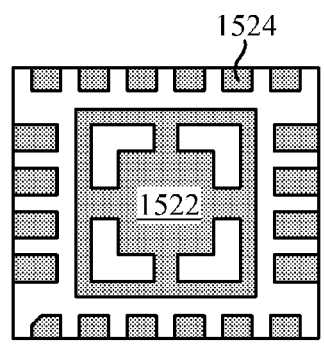
Fig. 15        Fig. 15A

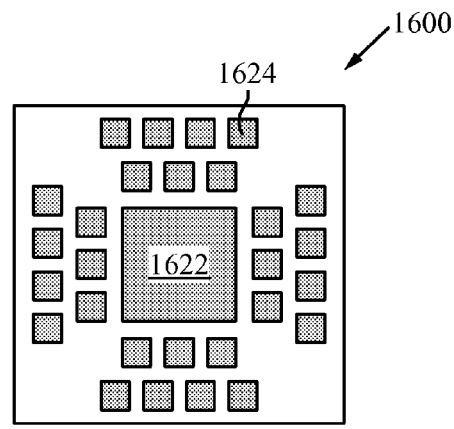
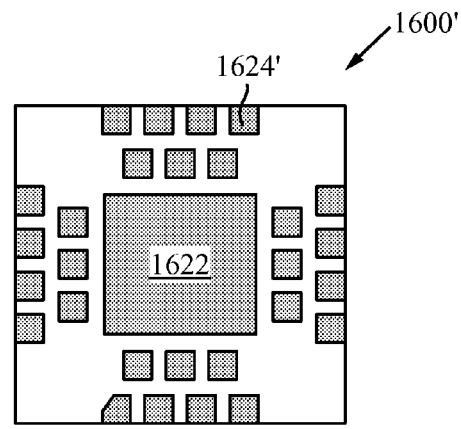
Fig. 16      Fig. 16A
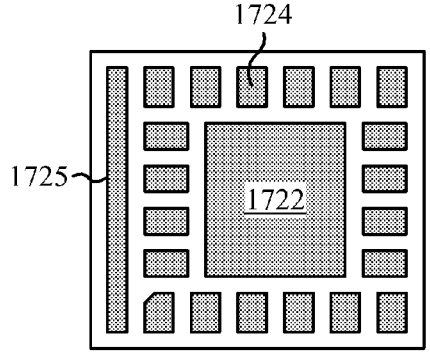
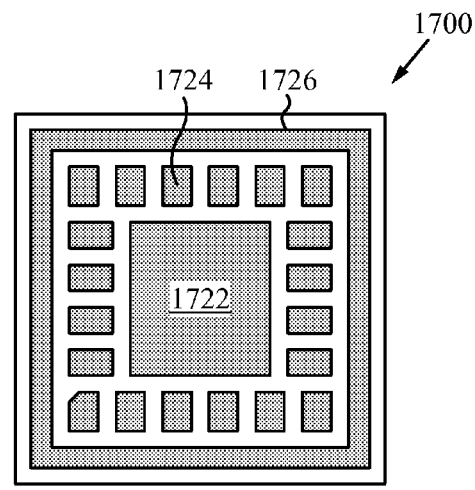
Fig. 17      Fig. 17A

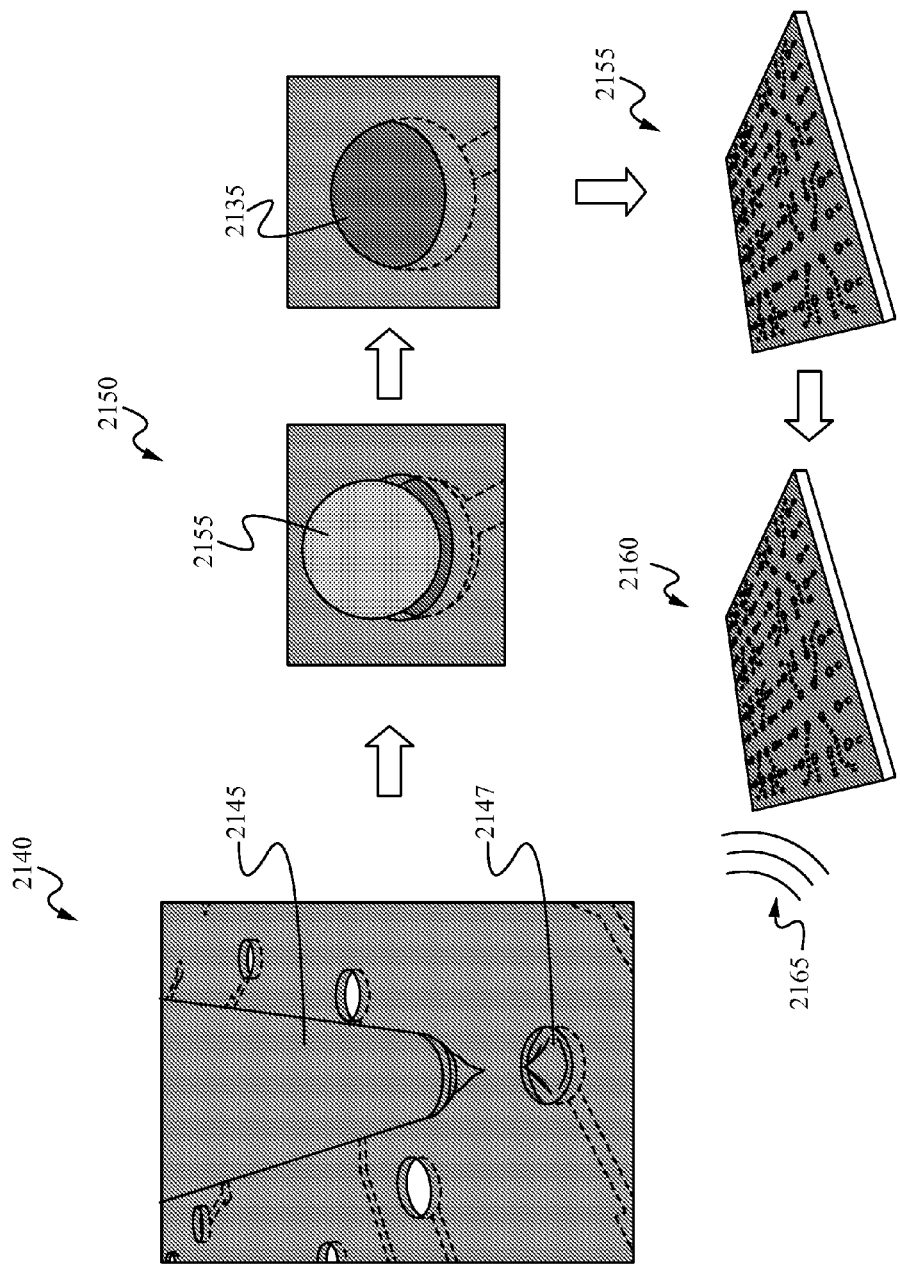

LEAD FRAME BALL GRID ARRAY WITH TRACES UNDER DIE HAVING INTERLOCKING FEATURES

RELATED APPLICATIONS

This invention is a Continuation-In-Part and claims priority under 35 U.S.C. §120 of U.S. patent application Ser. Nos. 13/080,512, filed Apr. 5, 2011 and entitled LEAD FRAME BALL GRID ARRAY WITH TRACES UNDER DIE, which claims benefit of priority under 35 U.S.C. section 119(e) of then co-pending U.S. Provisional Patent Application 61/455,881, filed Oct. 27, 2010, and is a Continuation-In-Part and claims priority under 35 U.S.C. §120 of U.S. patent application Ser. Nos. 11/731,522, filed Mar. 30, 2007 and entitled LEAD FRAME LAND GRID ARRAY," now U.S. Pat. No. 8,310,060, which claims benefit of priority under 35 U.S.C. section 119(e) of then co-pending U.S. Provisional Patent Application 60/795,929 filed Apr. 28, 2006, and U.S. patent application Ser. Nos. 13/040,112, filed Mar. 3, 2011 and entitled LEAD FRAME LAND GRID ARRAY WITH ROUTING CONNECTOR TRACE UNDER UNIT, which claims benefit of priority under 35 U.S.C. section 119(e) of then co-pending U.S. Provisional Patent Application 61/321,060 filed Apr. 5, 2010, all of which are incorporated herein by reference. This invention also claims priority under 35 U.S.C. section 119(e) of co-pending U.S. Provisional Patent Application No. 61/576,326 filed Dec. 15, 2011, and titled ENHANCED TERMINALS FOR SEMICONDUCTOR PACKAGES and is incorporated herein by reference.

FIELD OF THE INVENTION

The present invention is related to the field of semiconductor packaging. More specifically, the present invention is directed to lead frame land grid array (LLGA).

BACKGROUND

Current trends in integrated circuit packaging require a greater number of leads or solder bumps in a smaller and thinner form factor. To that end, the applicants have developed IC packaging technology relating to plating desired areas onto a metal substrate thereby forming several plated areas that serve as contacts, leads, die attach pads, or the like in Co Pending U.S. patent application Ser. No. 12/688,602. However, as IC developers produce ICs having a larger number of inputs and outputs (I/O), a greater number of contacts is required to the corresponding IC package. As the density of the contacts, or leads, are increased, what previously resulted were less robust IC packages. In some instances, the plated contacts or other structures peeled away from the finished IC package. Such peeling is exacerbated by requirements of more thin packages that in turn require more thin plating.

Furthermore, in some applications, it is desirable to have a semiconductor package that stands off from the application board to which it is mounted. IC packages having standoffs can be easier to mount onto a printed circuit board (PCB) or other application to which the package is being mounted to. In some applications, standoffs were mounted to contact pads on IC packages to provide the gap in space between the PCB and the IC package. However, the additional step of mounting standoffs proved to be unwieldy, costly, and not robust. To that end, makers of IC package solutions have developed methods wherein a monolithic sheet of copper substrate is selectively plated on both sides to form die attach pads and contacts. When the copper is etched away, the remaining portions between the plated areas form standoffs.

U.S. Pat. No. 6,451,627 to Coffman discloses a method and eventual apparatus wherein areas corresponding to contact leads and die attach pads are plated on one side of a monolithic copper substrate. On the other side of the substrate, Coffman teaches the formation of "mold locks." Coleman requires separate plating steps for each side of the substrate, adding process steps and cost. Coleman does not allow for routing traces under the die, thereby limiting contact density. U.S. Pat. No. 6,306,685 to Liu discloses a method and corresponding apparatus wherein both sides of a substrate are plated similarly, however Liu does not allow for routing traces under the die either, and similarly suffers from a lack of contact density. U.S. Pat. No. 7,671,452 to Bayan teaches contact traces under the die, however Bayan uses a standard pre-etched leadframe wherein the semiconductor die is placed upon the routing traces. However, the use of a pre-formed leadframe precludes plated structures that allow for the thinnest possible form factors. U.S. Pat. No. 7,095,096 to Mostafazadeh and US Pat. Publication 2010/0224971 to Li teach methods requiring multiple etching steps or other separate steps for forming routing and contact leads. As mentioned above, additional steps add unacceptable cost. It is well known that the semiconductor manufacturing industry is heavily cost sensitive, and semiconductor packages having fewer processing steps, thereby costing less to produce, are highly desirable.

SUMMARY OF THE DISCLOSURE

A carrier, or semiconductor package, for a semiconductor die is provided herein. The carrier generally comprises several routing traces that run underneath the die thereby allowing greater I/O density with respect to contacts placed around a die attach pad. The routing traces each have a standoff for facilitating easier assembly of the semiconductor package onto a PCB. In some embodiments, the standoffs are disposed at the ends of the routing traces. In other embodiments, the standoffs run the entire length of the routing traces. Generally, the standoffs are formed by plating both surfaces of a copper substrate. On a top surface of the substrate, routing traces are formed. On a bottom surface, contact points are formed. When the copper substrate is etched away, the portions of the copper substrate between the plated layers remain, thereby forming standoffs. As will be made clear by the appended drawings and corresponding descriptions, the standoffs can be made into any desired shape or form factor. The standoffs can be at single contact points, or run the entire length of a routing trace, or anything in between. The standoffs can be metallized to prevent corrosion and enhance solder adhesion. Also, an underfill layer can be formed to encapsulate the standoffs. Advantageously, the package can be extremely thin while still utilizing standoffs. Further advantageously, the routing traces under the die can act as a thermal sink for the semiconductor die.

In a first aspect of the invention, a packaged semiconductor comprises a semiconductor die. A plurality of plated routing traces each have a first contact point and at least one additional contact point. A plurality of wirebonds electrically couple the semiconductor die to the first contact points of the routing traces. A standoff is disposed at or adjacent at least some of the additional contact points having plurality of plated layers on a surface opposite from the routing traces. Preferably, encapsulant for encapsulates the semiconductor die such that at least a portion of the standoffs are exposed. The routing traces comprise layers of any among a list of gold, silver, palladium, nickel and any alloy combination thereof. The person of ordinary skill having the benefit of this disclosure will appreciate that other metals can be used. In some embodiments, the die is mounted to a thermally conductive and electrically insulative adhesive, thereby effectuating thermal transfer from the die to the PCB while allowing greater contact density. To that end, a portion of the routing traces can be disposed under the semiconductor die.

The standoff preferably comprises a portion of an etched monolithic sheet of copper. In some embodiments, the standoff runs a length of the routing trace from the each additional contact point to the first contact point. Optionally, the exposed portions of the standoffs are metallized for solderability preservation. Alternatively, an underfill layer for at least partially encapsulating the exposed portions of the standoffs is disposed. The thickness of the underfill layer can be less than or equal to the thickness of the standoffs. For increased standoff height, solder balls can be mounted to at least some of the standoffs for increasing a standoff height of the device. For enhanced reliability and a more robust semiconductor package, least some of the additional contact points can have support structures. For example, the support structures extend outward from the additional contact points, or substantially circumscribe the additional contact points. In such an embodiment, the exposed portion of the standoff and second set of plated layers can be metallized.

In another aspect of the invention, a method of making a packaged semiconductor device comprises plating a first pattern on a top surface of a monolithic substrate thereby forming a plurality of routing traces each having a first contact point and at least one additional contact point. Plating a second pattern on a bottom surface of a monolithic substrate. Mounting a semiconductor die and attaching wirebonds from the semiconductor die to the first contact points of the routing traces. Encapsulating, etching away the portions of the monolithic substrate not plated by the second pattern thereby forming standoffs disposed at at least some of the additional contact points. Finally, singulating the semiconductor device is singulated. The first or second pattern can be of any suitable metals, such as but not limited to gold, silver, nickel, palladium and any alloy combination thereof. Preferably, plating a first pattern comprises arranging the first pattern such that the routing traces are disposed under the semiconductor die. For enhanced solderability and to prevent corrosion, the method can include metallizing any exposed portion of the standoffs, such as by plating or deposition. Alternatively, the method can include forming an underfill layer for encapsulating at least a portion of the standoffs. In embodiments where a standoff is still needed, the underfill layer can be formed having a thickness less than a thickness of the standoffs. If further standoff height is needed, the method can include mounting solder balls on the standoffs.

In some embodiments, the first pattern and the second pattern are mirror images of one another, and each standoff runs an entire length of the first pattern and second pattern. In such embodiments, when the copper layer is etched away, the standoff will run the entire length of the routing trace. Such an embodiment provides for a very robust connection with a PCB, and enhanced reliability since there is a decreased likelihood of the plated layers experiencing peeling. Advantageously, the embodiments of this method require only one etching step. Furthermore, only one plating step is required since both sides of the substrate can be plated simultaneously, regardless of the patterns on both sides.

BRIEF DESCRIPTION OF THE DRAWINGS

The novel features of the invention are set forth in the appended claims. However, for purpose of explanation, several embodiments of the invention are set forth in the following figures.

FIG. 4 illustrates a package having contact pads that are not at the edge of the package.

FIG. 5 illustrates a package having a die that is larger than its die attach pad.

FIG. 6 illustrates a die overhanging its die attach pad.

FIG. 7 illustrates a die having a size that is close to the size of a package.

FIG. 8 illustrates solder balls are optionally used to couple the die to the contact pads.

FIG. 9 illustrates a package that is a hybrid of flip chip and wire bonding methods.

FIGS. 10-12 illustrate a stacked die implementation.

In particular, FIG. 10 illustrates stacked die where one die is smaller than another die.

FIG. 11 illustrates stacked die that are approximately the same size with a spacer die.

FIG. 12 illustrates stacked die that are approximately the same size with epoxy instead of a spacer die.

FIGS. 13-17 illustrate various bottom view configurations for multiple embodiments of the invention.

In particular, FIG. 13 illustrates contact pads at the sides of a die pad, according to some embodiments.

FIG. 13A illustrates the package of FIG. 13 with the contact pads at the edge of the package.

FIG. 14 illustrates contact pads surrounding the periphery of the die pad.

FIG. 14A illustrates the package of FIG. 14 with the contact pads at the edge of the package.

FIG. 15 illustrates a die pad having an exposed center.

FIG. 15A illustrates an alternative configuration for the die pad and with contact pads at the edge of the package.

FIG. 16 illustrates multiple rows of contact pads surrounding the periphery of the die pad.

FIG. 16A illustrates the package of FIG. 15 with the outer most row of contact pads at the edge of the package.

FIG. 17 illustrates a guard band according to some embodiments.

FIG. 17A illustrates a guard ring in accordance with some embodiments of the invention.

FIG. 21B illustrates a portion of a process for making the semiconductor package per an embodiment of this invention.

DETAILED DESCRIPTION

In the following description, numerous details and alternatives are set forth for purpose of explanation. However, one of ordinary skill in the art having the benefit of this disclosure will realize that the invention can be practiced without the use of these specific details. In other instances, well-known structures and devices are shown in block diagram form in order not to obscure the description of the invention with unnecessary detail.

I. Method

Figure 1:
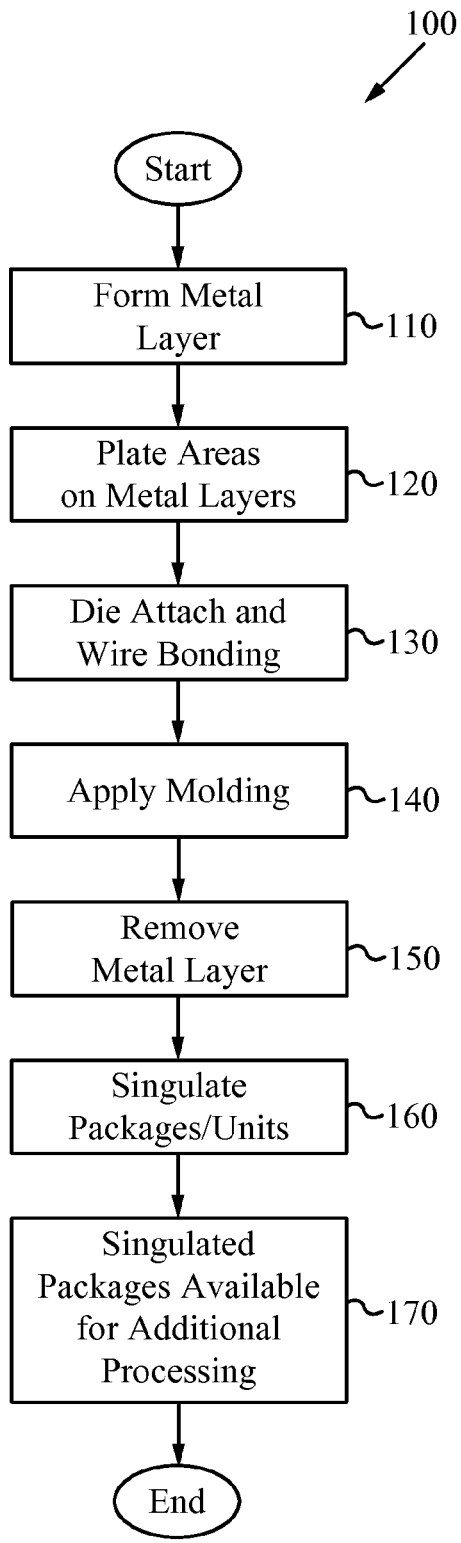
FIG. 1 illustrates a process according to some embodiments of the invention.
Figure 1A:
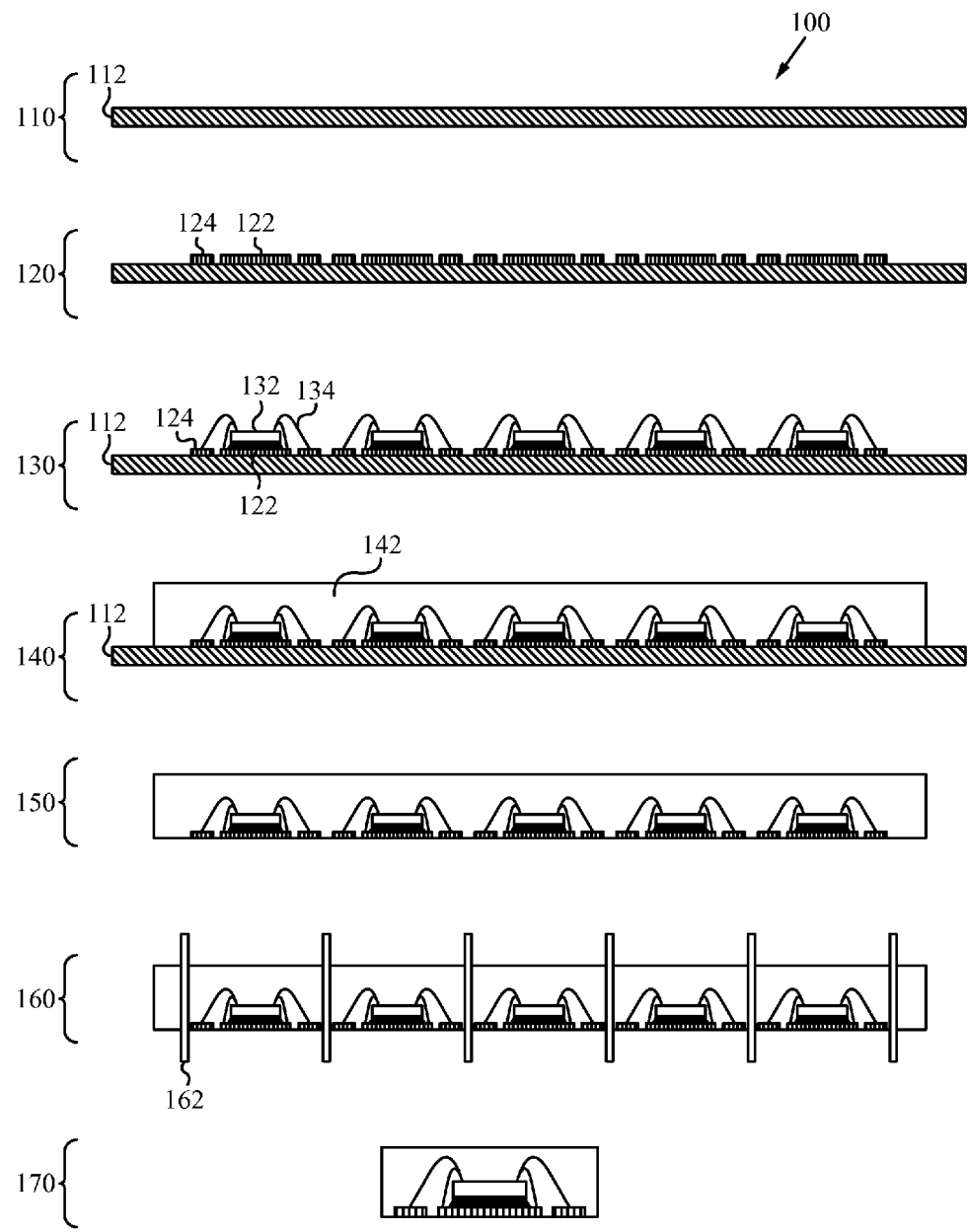
FIG. 1A illustrates an exemplary result for each step in the process of FIG. 1.

FIG. 1 illustrates a process 100 of manufacturing a semiconductor package according to some embodiments of the invention. FIG. 1A illustrates an exemplary result for each step in the process 100 of FIG. 1. As shown in these figures, the process 100 begins at the step 110, where a metal layer 112 is formed. The metal layer typically comprises copper, Alloy 42, or another suitable metal material, and has a typical thickness of about 0.1 to 0.15 millimeters. Then, after the step 110, the process 100 transitions to the step 120, where particular areas on the metal layer 112 are plated. These areas typically include an area for a die pad 122 and a contact pad 124.

Once the particular areas on the metal layer 112 are plated, the process 100 transitions to the step 130, where die attach and/or wire bonding occur. As shown in FIG. 1A, die attach typically includes coupling a die 132 to the die attach pad 122, while wire bonding includes using a wire 134 to couple the die 132 to the die pad 122 and/or one or more contact pads 124.

After die attach and/or wire bonding occur at the step 130, the process 100 transitions to the step 140, where a molding 142 is applied. Typically the molding 142 includes a plastic polymer or resin that encapsulates the die 132, the wire bonds 134, the top surface of the metal layer 112, and the top surface of the plated areas, including the die pad 122 and the contact pads 124.

Once the molding 142 is applied at the step 140, the process 100 transitions to the step 150, where the metal layer 112 is removed. Some embodiments employ a chemical etchant to etch away the metal layer 112 without affecting the plated areas (122 and 124) or the molding 142. In these embodiments, when the metal layer 112 is etched away, the bottom surfaces of the plated areas, including the die pad 122, and the contact pads 124, are typically exposed.

At this point, some embodiments have formed a molded block 300 (see FIG. 3) having exposed plated contact areas. Such a configuration has particular advantages in the industry. For instance, the molded block 300 is advantageously employed for testing and other processes after the step 150 of FIG. 1. The testing of some embodiments comprises a parallel, high speed, and/or bulk process for several of the devices located within the molded block 300. The molded block 300 of these embodiments is further described below in relation to FIG. 3.

Figure 2:
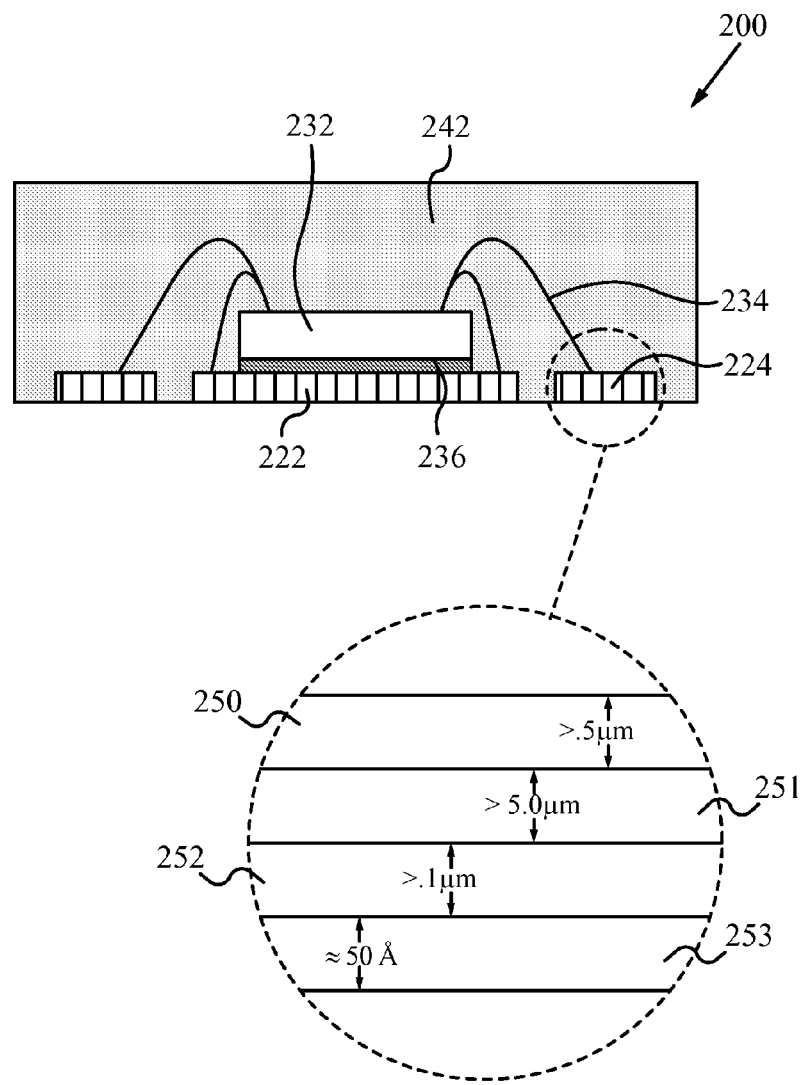
FIG. 2 illustrates an exemplary product of the method of some embodiments in further detail.

Regardless of any testing and/or additional process steps after the step 150 of FIG. 1, the process 100 typically transitions to the step 160, where individual units contained within the molded block 300 are singulated to form individual semiconductor devices in packages (see FIG. 2). Then, the process 100 transitions to the step 170, where the singulated packages are available for additional testing, processing, shipping and/or use. However, testing, handling, and/or processing of individual singulated packages at the step 170, rather than by using the molded block 300 (available after the step 150), presents certain disadvantages, as discussed below. After the step 170, the process 100 concludes.

FIG. 2 illustrates an exemplary package 200 of the method of some embodiments in further detail. As shown in this figure, the exemplary package 200 has an exposed die attach pad 222, one or more contact pads 224, a semiconductor die 232, one or more wire bonds 234, an adhesive 236, and a molding compound 242. The adhesive 236 preferably couples the die 232 to the die attach pad 222. The wire bonds 234 typically couple the die 232 to one or more contact pads 224 and/or the die attach pad 222.

Also shown in FIG. 2, the plating of some embodiments comprises multiple layers. For instance, the plating layers of some embodiments can include but are not limited to palladium, nickel, and/or gold. In a particular embodiment, a first layer of palladium 250 has a minimum thickness of 0.5 micro meters, a layer of nickel 251 has a minimum thickness of 5.0 micro meters, a second layer of palladium 252 has a minimum thickness of 0.1 micro meters, and a layer of gold 253 has a thickness of about 50 Angstroms. In some of these particular embodiments, the first layer of palladium is located near an interior of the package for providing a coupling locus to the wire bond 234, while the gold plating is preferably located near, or is exposed near the bottom surface of the package 200, for providing a contact locus to a printed circuit board, or the like. The plated area (the die pad and contact pads) of these embodiments typically has a total thickness in the range of about 6.0 micro meters to 12.0 micro meters. As mentioned above, the plated area(s) and the molding are minimally or not affected by the removal of the metal layer at the step 150 of FIG. 1. For instance, when the metal layer comprises copper, and the removal step 150 involves using a chemical etchant, preferably, the etchant and/or the plating structure are selected such that the etchant is reactive (removes) the metal layer with minimal effect to the plating. An example of such an etchant includes cupric chloride.

Figure 3:
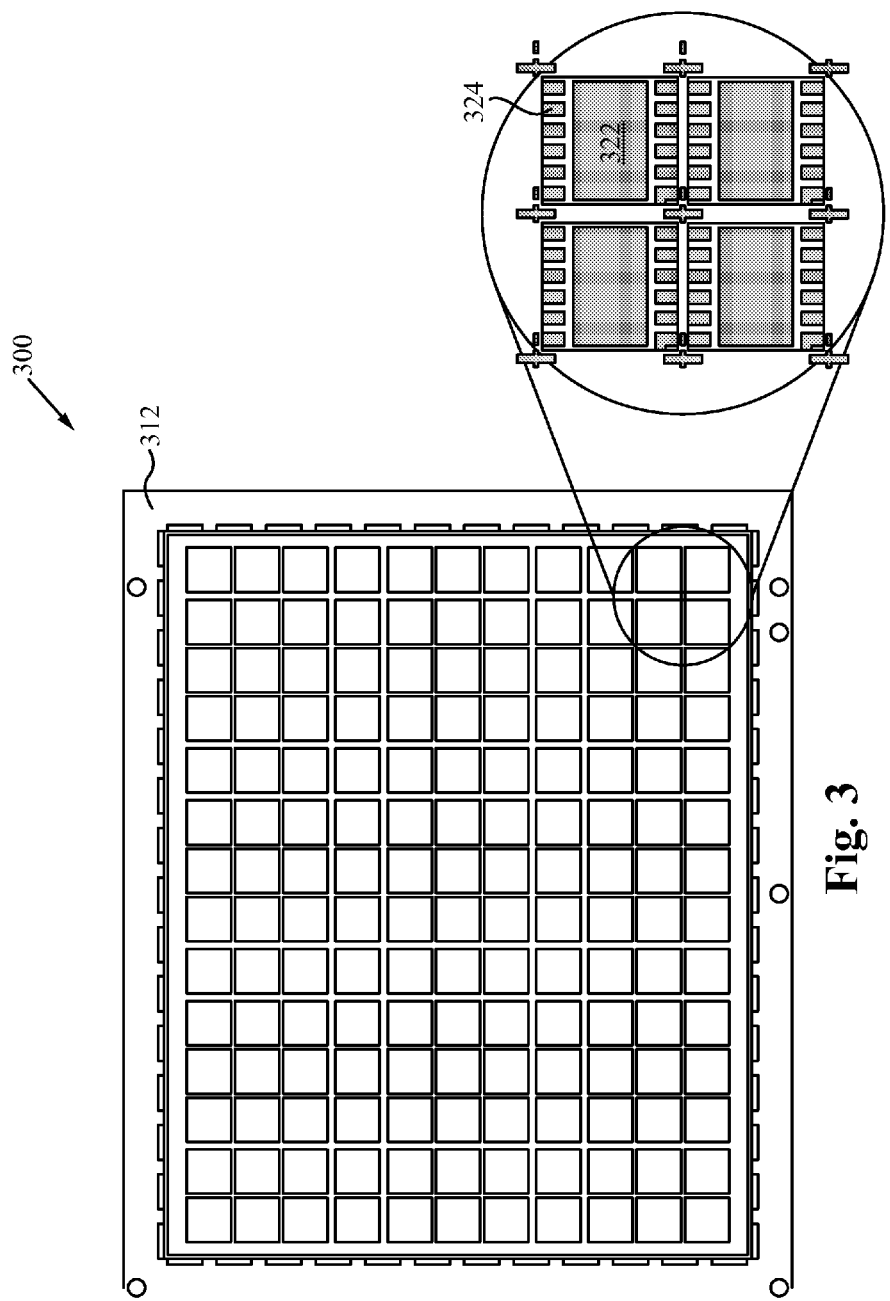
FIG. 3 illustrates a molded block in accordance with some embodiments.

Also mentioned above, the molded blocks produced during the process 100 have certain advantages for handling and additional processing, over the individual singulated packages illustrated in FIG. 2. FIG. 3 illustrates a molded block 300 in accordance with some embodiments. As shown in this figure, the molded block 300 includes plated areas (that typically include die pads 322 and/or contact pads 324) for attaching potentially many semiconductor devices. Also shown in FIG. 3, the molded block 300 has an attached metal layer 312 that was used for the plating and molding (encapsulation) steps to generate the molded block 300. As mentioned above, the metal layer 312 is preferably etched away to expose the plated areas of the molded block 300.

The molded block 300 of these embodiments has certain advantages, particularly for the manipulation and testing of semiconductor devices. For instance, the molded block of a particular embodiment has dimensions of approximately 1.77×2.0 inches, and includes approximately 250 to 2,500 semiconductor units. This molded block, due to its molding strength and particular size, allows for parallel processing of substantially all of the semiconductor devices within the molded block, simultaneously. Conventionally, semiconductor device and/or package processing includes time consuming operations, such as test, for example. However, parallel processing of such operations advantageously enhances the speed and reliability of performing such operations, for bulk quantities.

II. Streamlined Process and Configuration Advantages

The process 100 described above, further includes additional advantages. For instance, due to the direct use of the metal layer and plated areas, and the subsequent removal of the metal layer to expose the plated areas, embodiments of the invention reduce the number of process steps required for semiconductor package formation. This presents cost savings, and time savings, which present additional cost savings, over conventional methods. These and other advantages are discussed in further detail below, in relation to the referenced figures.

FIGS. 4-17 illustrate various side and/or bottom view configurations for multiple embodiments of the invention. Some of these embodiments are formed by using the process 100 described above in relation to FIGS. 1 and 1A. As illustrated in FIGS. 4-17, these packages have several advantages.

(1) For instance, as mentioned above, the process 100 has fewer steps of fabrication than conventional methods known in the art. Because the process 100 has fewer steps, it is less expensive than the processes known in the art. Moreover, because the process 100 has fewer steps, it is also generally faster than other processes, or, in other words, has a higher throughput.

(2) The process 100 is capable of yielding package sizes that are close to the dimension of the packaged die inside the package. The advantages of reductions in package size are understood by those of ordinary skill. For example, a package having a footprint that is approximately its die size will require a mounting area on a circuit board that is not much greater than approximately the size of the die. Thus, this advantage allows the placement of many more semiconductor devices on a board, or the use of a smaller circuit board, which further typically results in smaller form factor applications, and additional size and/or cost savings, such as from reduced shipping and manufacturing costs, for example.

(3) Further, a package having a thickness close to the die thickness encapsulated inside the package allows for lower profile implementations that use such small outline and/or low profile packages.

(4) Because the critical factor regarding height for the packages formed by the process 100, is typically the height of the die, or another factor, the height of the contact pads has no or negligible impact on the height of the package. Effectively, the contact pads have a zero, or almost zero, height in relation to the height of the package and/or the die.

(5) Additionally, because the process 100 has fewer steps, and its products are typically close in size to the small encapsulated die, the packages illustrated and described herein provide savings in the volume of construction materials consumed over time, or, in other words, provide a higher yield. Moreover, the various many possible package configurations enabled by the process 100 described above, yield further advantages, as discussed below.

III. Side ("Cross Section") Views of Exemplary Package Designs

Figure 4:
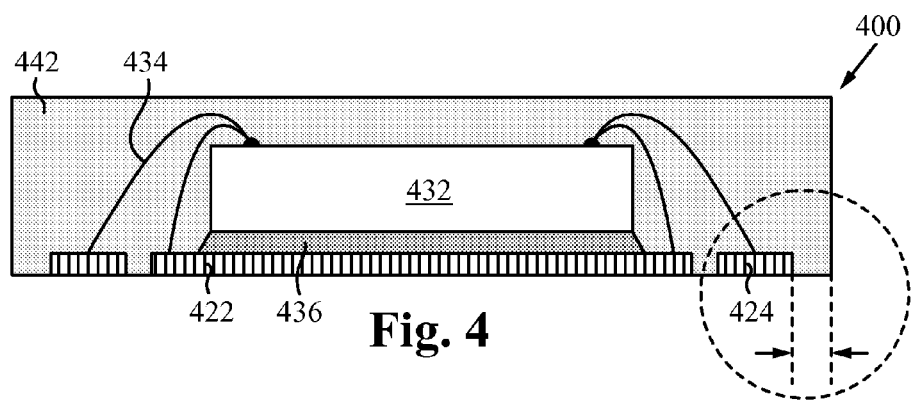
FIGS. 4-12 illustrate cross section views taken on a side of a package in accordance with some embodiments.
Figure 4A:
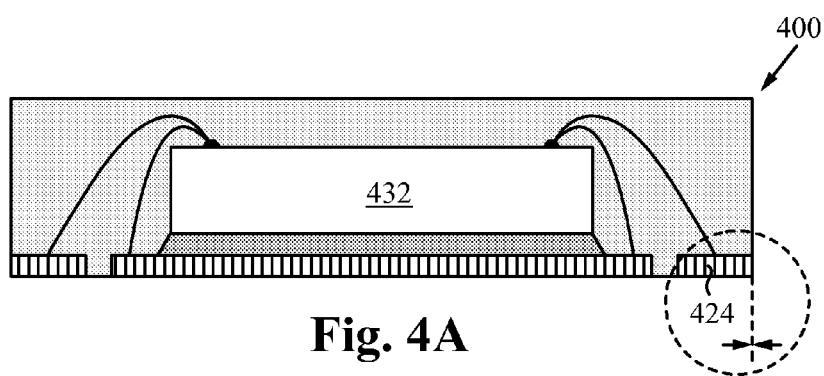
FIG. 4A illustrates a package having contact pads that are at the edge of the package.

FIGS. 4-12 illustrate a cross section (side view) of the package of some embodiments. For instance, FIG. 4 illustrates a package 400 having contact pads 424 that are not at the edge of the package 400, while FIG. 4A illustrates a package having contact pads 424 that are at the edge of the package 400. Some embodiments alternatively select whether the contact pads 424 should be placed at the edge of the package 400. Some embodiments of the process 100 illustrated in FIGS. 1 and 1A above, account for the position of the contact pads 424 at the step 120 (plating) and/or the step 150 (singulation). As an example, some embodiments plate areas for the contact pads of two adjacent packages close together during the plating step 120 of FIG. 1. Then, during the singulation step 150 of FIG. 1, these embodiments singulate or remove the entire molding and unplated regions between the two contact pads, such that the resultant two separate packages to the left and right of the singulation cut have contact pads that are at the edge of the package. These packages are typically smaller in size and have a slightly smaller footprint due to the maximum use of the edge of the package for the contact pad. Hence, and as additionally shown in FIGS. 4 and 4A, the decision whether the contact pads 424 are placed at edge of the package 400, or not, affects the overall footprint and space available within and at the bottom footprint of the package 400.

Figure 5:
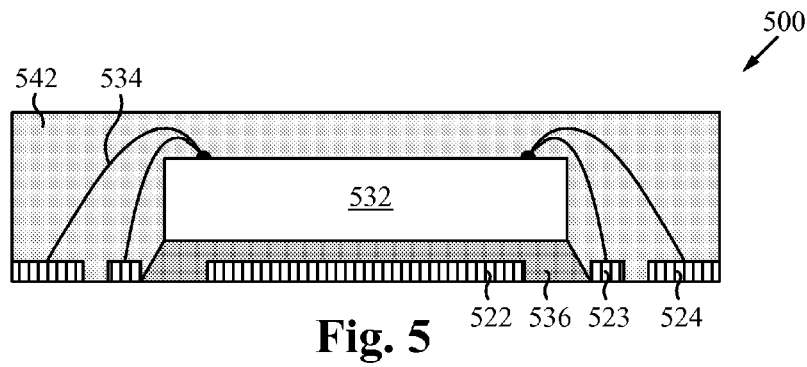
Figure 5A:
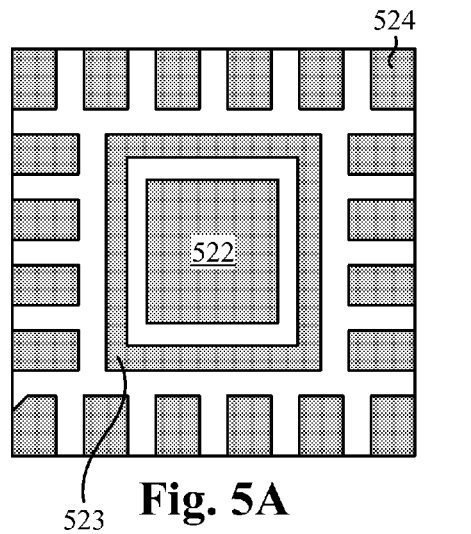
FIG. 5A illustrates a bottom view for the package of FIG. 5 having a ring around the die attach pad.
Figure 5B:
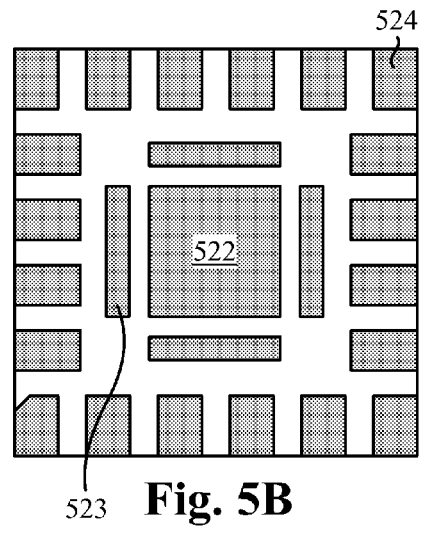
FIG. 5B illustrates an alternate bottom view for the package of FIG. 5, which has a discontinuous ring around the die attach pad.

Some embodiments have various additional configurations for the contact pads and the die pad that vary, in some aspects, in relation to the die. For instance, FIG. 5 illustrates a package 500 having a die 532 that is larger than its die attach pad 522. As shown in this figure, the die 532 of some of these configurations overhangs the die pad 522. In these configurations, an adhesive 536 typically used to secure the die 532 to the die pad 522, often spans the surface of the die pad 522 and spills over to engulf the surfaces of the die pad 522 that are not shielded by the metal layer during the encapsulation step (140 of FIG. 1). Due to the additional space between the die pad 522 and the edge-located contact pads 524, some of these configurations further include an additional plated ring around the die pad 522. Some of these rings are continuous, while some are discontinuous around the die pad 522. FIG. 5A illustrates a bottom view for the package 500 of FIG. 5 having a ring 523 around the die pad 522. FIG. 5B illustrates an alternate bottom view for the package 500 of FIG. 5, which has a discontinuous ring 523 around the die attach pad 522.

These plated areas 523 between the die pad 522 and the contact pads 524 provide additional plated areas for electrical contact and/or heat transfer for the package 500. Some embodiments, for instance, couple the die to the plated ring, particularly where the die overhangs the die pad, while some embodiments forego the die pad altogether in favor of the plated ring of these embodiments. More specifically, the purpose of the plated ring of particular embodiments is that some die designs, such as the "ground bond" design, require a connection between a top surface of the die, and a ground of the printed circuit board. In these embodiments, the plated ring 523 provides the grounding point between the printed circuit board. Some designs and a die require a connection between a top surface of the die, and both the plated ring area 523 and a contact pad 524. These designs, often referred to as "down bond" designs, typically include a wire bond between the plated ring 523, and the contact pad 524 (not shown).

Figure 6:
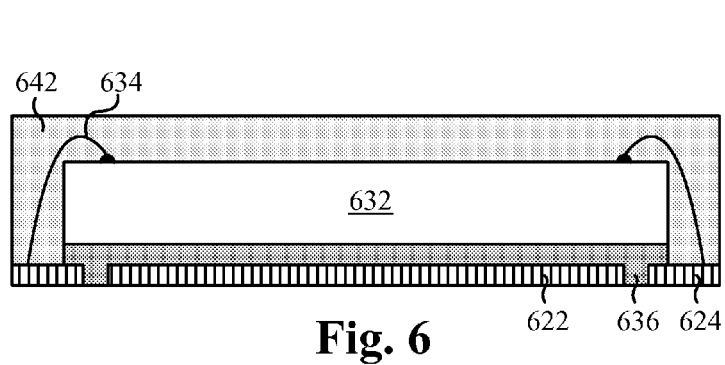

In additional embodiments, when the die overhangs the die pad, the die is attached to the die pad and is also advantageously attached to a portion of one or more contact pads. FIG. 6 illustrates such an embodiment where a die 632 that overhangs its die pad 622 is further attached to one or more contact pads 624 via wire bonds. As shown in this figure, an adhesive 636 attaches the die 632 to both the die pad 622 and to the portions of the contact pads 624 that underlie the overhanging sides of the die 632.

Figure 7:
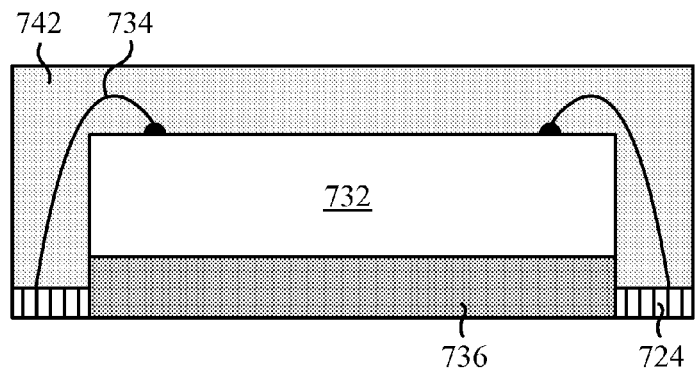

In some of the embodiments described above, or in other embodiments, the dimensions of the die approaches the size of the package. In other words, for very small packages, or for large die in relation to the size of the package, it is advantageous to optionally omit the die pad altogether. FIG. 7 illustrates such a package 700 that includes a die 732 having a size that is close to the size of the package 700. As shown in this figure, the die pad is omitted, such as during the plating step 120 of FIGS. 1 and 1A, above. In these embodiments, the omission of the die pad advantageously contributes to a reduction in form factor for the package 700.

Figure 7A:
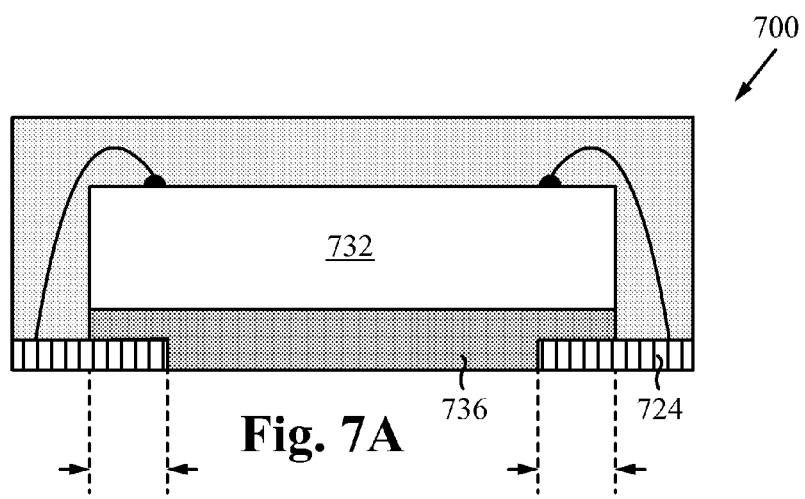
FIG. 7A illustrates a die similar in size to its package such that the die overhangs its die pad and the overhanging portion is bonded to the contact pads.

However, in some embodiments, it is often still desirable to provide external contact to the die pad, such as for electrical contact and/or heat dissipation, for example. FIG. 7A illustrates a die 732 having a similar size to a package 700, where the die 732 extends over the contact pads 724 and is bonded to the contact pads 724 by the adhesive 736.

Figure 8:
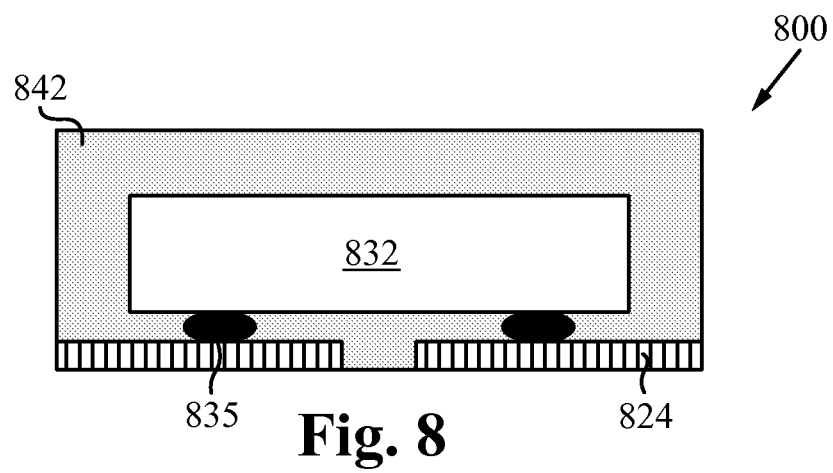

FIG. 8 illustrates that not only bond wires, but also solder balls 835 are (alternatively) applied for electrical connection between the die 832 and the contact pads 824 of alternative embodiments. This is also sometimes known as a flip chip style package.

Figure 9:
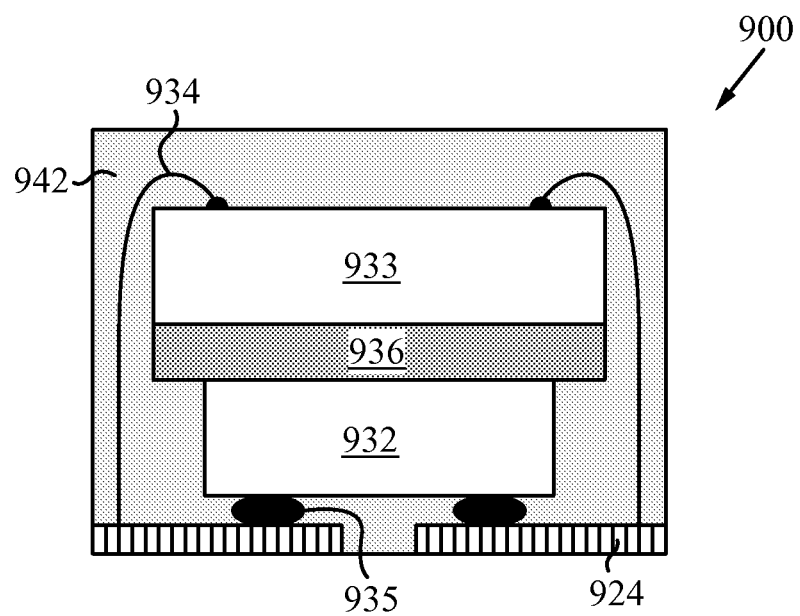

FIG. 9 illustrates that some embodiments have multiple die 932 and 933, which are stacked by using a hybrid of flip chip and wire bond techniques. Accordingly, the die 932 is coupled to the contact pads 924 by using solder balls 935 in the flip chip style, while the die 933 is coupled to the contact pads 924 by using bond wires 934. Further, the die 932 is coupled to the die 933 by using an adhesive 936.

Stacked Die

Figure 10:
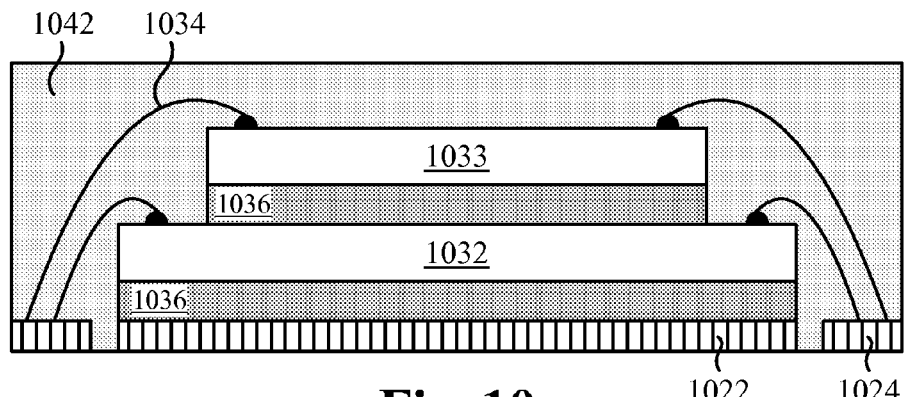
Figure 11:
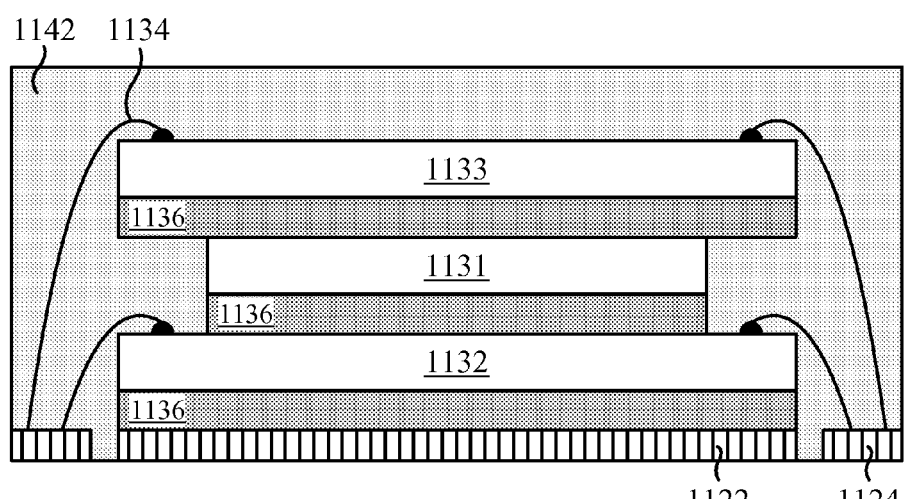
Figure 12:
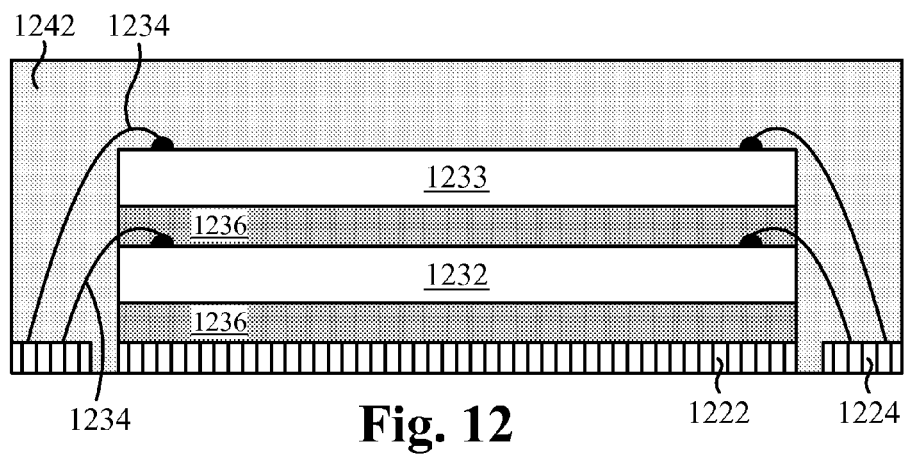

The packages of the embodiments described above further allow for a "stacked die" package configuration. Multiple and/or stacked die significantly increase the number of alternative configurations. FIGS. 10-12 illustrate some exemplary stacked die implementations in accordance with embodiments of the invention.

More specifically, FIG. 10 illustrates a daughter die 1033 that has a smaller size than a mother die 1032. As shown in this figure, the die 1033 is attached to the die 1032, which is attached to a die pad 1022. Typically, the attachment is by an adhesive 1036, while bonding wires 1034 couple the dice 1032 and 1033 to one or more contact pads 1024.

FIG. 11 illustrates a case where the daughter die 1133 and the mother die 1132 have the same approximate size. In these embodiments, a spacer die 1131 is advantageously inserted between the two stacked dice 1132 and 1133. As shown in the figure, the spacer die 1131 permits access to the die 1132 such that bond wires 1134 couple the die 1132 to the contact pads 1124.

FIG. 12 illustrates another option when the daughter die 1233 and the mother die 1232 have the same approximate size. In this configuration, an adhesive 1236 is applied directly between the two dice 1232 and 1233, instead of a spacer die. The adhesive 1236 of these embodiments includes an epoxy such as that used for die attach to a die pad, or another thermal, electrical, and/or adhesive material. As shown in FIG. 12, the adhesive advantageously permits access to the die 1232, such as by the bond wire 1234, for example.

IV. Bottom ("Floor Plan") Views

FIGS. 13-17 illustrate bottom views of the connector and/or mounting side of some of the packages described above.

More specifically, FIG. 13 illustrates a package 1300 that has contact pads 1324 at the sides of a die pad 1322. In this type of package 1300, the heat which is generated by the encapsulated semiconductor device (1332) during operation of the device (1332), is preferably transferred to the PCB via the die pad 1322. FIG. 13A illustrates the package 1300 of FIG. 13, with the contact pads 1324 at the edge of the package 1300.

FIG. 14 illustrates a package 1400 that has contact pads 1424 at the periphery of the die pad 1422. Moreover, these contact pads 1424 surround the die pad 1422 for achieving the benefit of higher pin counts in the small area of the package 1400. In FIG. 14, the contact pads 1424 are not at the edge of the package 1400, while in FIG. 14A, the contact pads 1424 are at the edge of the package 1400.

FIGS. 15 and 15A illustrate an alternative configuration for the die pad of FIG. 14. In FIG. 15, the die pad 1522 comprises a plated ring with an exposed center, while in FIG. 15A the die pad 1522 comprises a plated ring with a central plated portion attached to the ring with four connecting bars.

FIG. 16 also illustrates contact pads 1624 at the periphery of the die pad 1622, but in more than one perimeter or circumference around the die pad 1622. This implementation typically yields even higher pin counts for the small package 1600. In FIG. 16A a portion of the contract pads 1624 are positioned at the edge of the package 1600.

FIG. 17 illustrates contact pads 1724 at a periphery of the die pad 1722 with a security guard band 1725. As shown in this figure, some embodiments have only one guard band 1725. However, the package 1700 of other embodiments employ more than one guard band 1725. In fact, the guard band of some embodiments fully surrounds the die pad 1722, as a guard ring. FIG. 17A illustrates such an embodiment having contact pads 1724 at a periphery of the die pad 1722 with a security guard ring 1726.

The guard band 1725 and/or guard ring 1726 of these embodiments take advantage of and/or enable reduced contact pad height. As mentioned above, the contact pad height of some embodiments is zero, or almost zero. Some applications in the security field require an "unable" to test signal from the bottom of the package after installing the package on a PCB. The security guard band and/or ring is an additional (double) security measure that protects against having an open space, and/or separation of the package from the PCB during the insertion of a test signal probe between the (bottom of the) package and the PCB upon which the package is typically (surface) mounted. More specifically, the additional plated and/or metal soldering area for securing the package to the PCB, protects the contact pads and/or die pad of the package from undesirably separating from the PCB during handling, test, or another similar type of operation.

V. Plated Ball Grid Array

Figure 18:
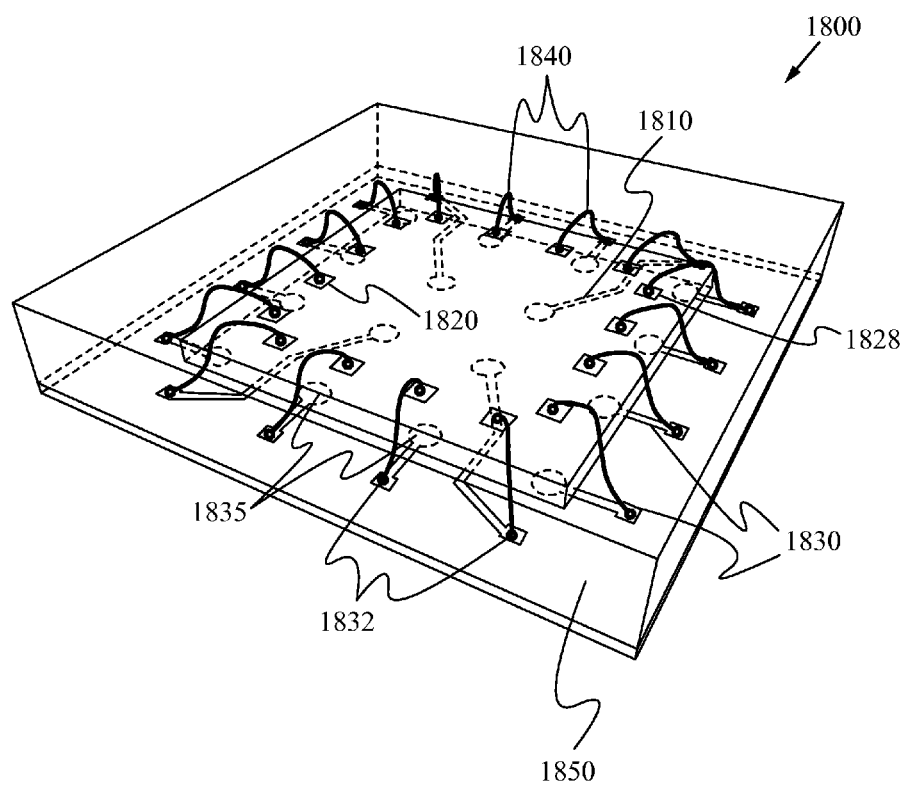
FIG. 18 illustrates a semiconductor package in phantom view per an embodiment of this invention.

FIG. 18 shows a plated ball grid array package 1800 in isometric phantom view. The package 1800 comprises a semiconductor die 1810 having an active surface facing up toward the viewer and an inactive surface facing down. The active surface has several wirebonding pads 1820. These wirebonding pads 1820 serve as input/outputs for the semiconductor die 1810, for example providing power, control, inputs signals, desired outputs, and the like. The package 1800 further comprises a plurality of contact traces 1830. The contact traces 1830 each have a first end 1832 and a second end 1835. A bondwire 1840 is mounted to at least some of the first ends 1832 and to the wirebonding pads 1820 for forming an electrical connection between the die and the contact traces 1830 as desired. The second ends of the contact traces 1830 are configured with solder balls or solder bumps as explained below to form an electrical contact with an end application, usually a printed circuit board. The contact traces 1830 are arranged substantially underneath the semiconductor die 1810. This arrangement allows for the overall package 1800 to be only slightly larger than the semiconductor die 1810 itself. Furthermore, the contact traces 1830 are formed by plating methods described above. Also, the semiconductor die 1810 can be made extremely thin by die grinding techniques (sometimes known as backgrinding) that are able to produce semiconductor die that are fractions of millimeters thick. As a result, what is achieved is a highly thin, lightweight, very small semiconductor package 1800.

Figure 19A:
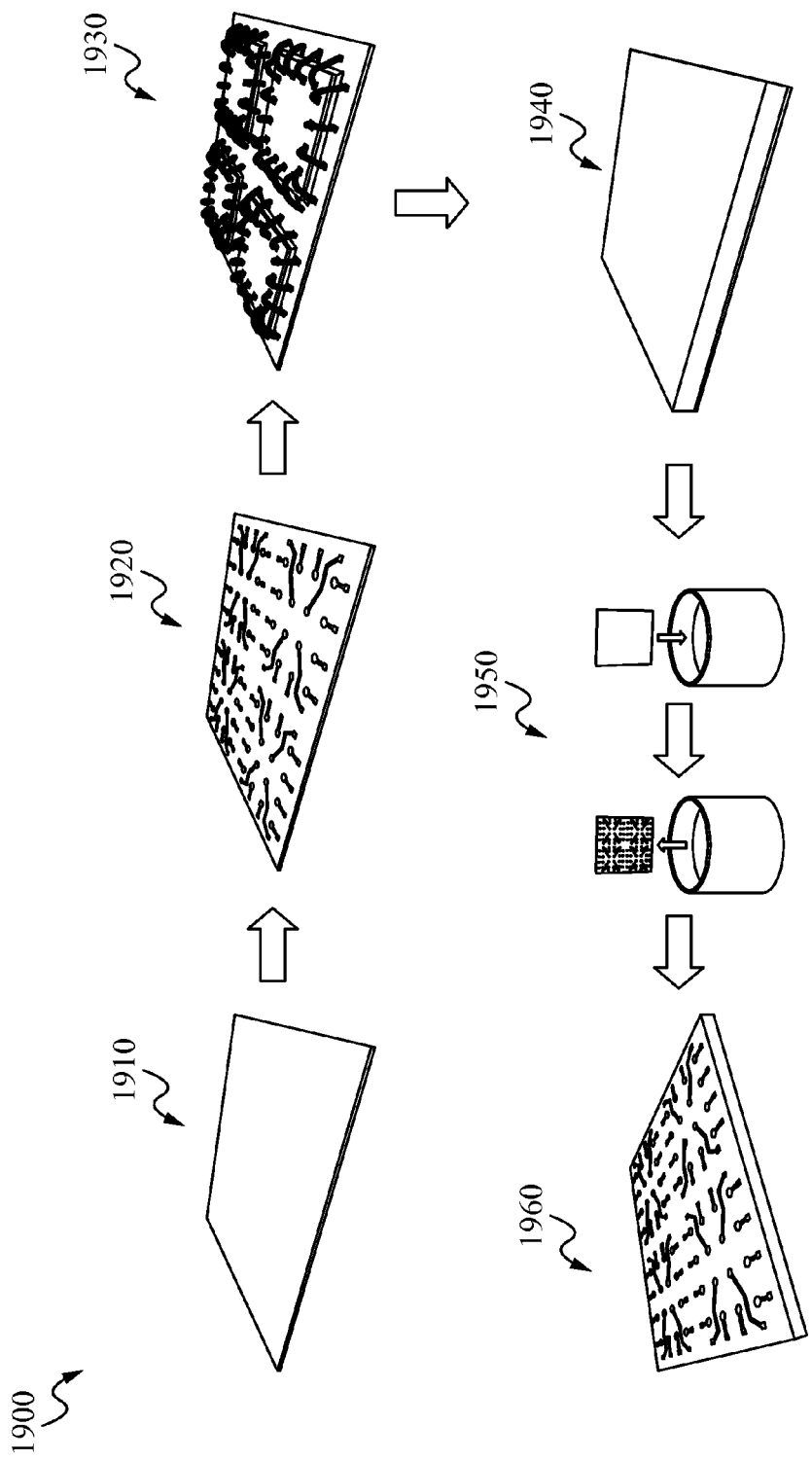
FIG. 19A illustrates a portion of a process of making the semiconductor package per an embodiment of this invention.

FIG. 19A shows some steps of a process 1900 for forming the semiconductor package 1800 of FIG. 18. In a first step 1910, a metal substrate, preferably copper, is provided. In a later step 1920, a desired pattern of traces is plated upon the metal substrate. In a later step 1930, semiconductor die are mounted on the metal substrate above the traces and wirebonds are mounted to form electrical contacts as described above in FIG. 18. In a later step 1940, the substrate, semiconductor die, wirebonds, and contact traces are encased in a mold compound. In a step 1950, the metal substrate is sacrificed, leaving the contact traces visible in the later step 1960.

Figure 19B:
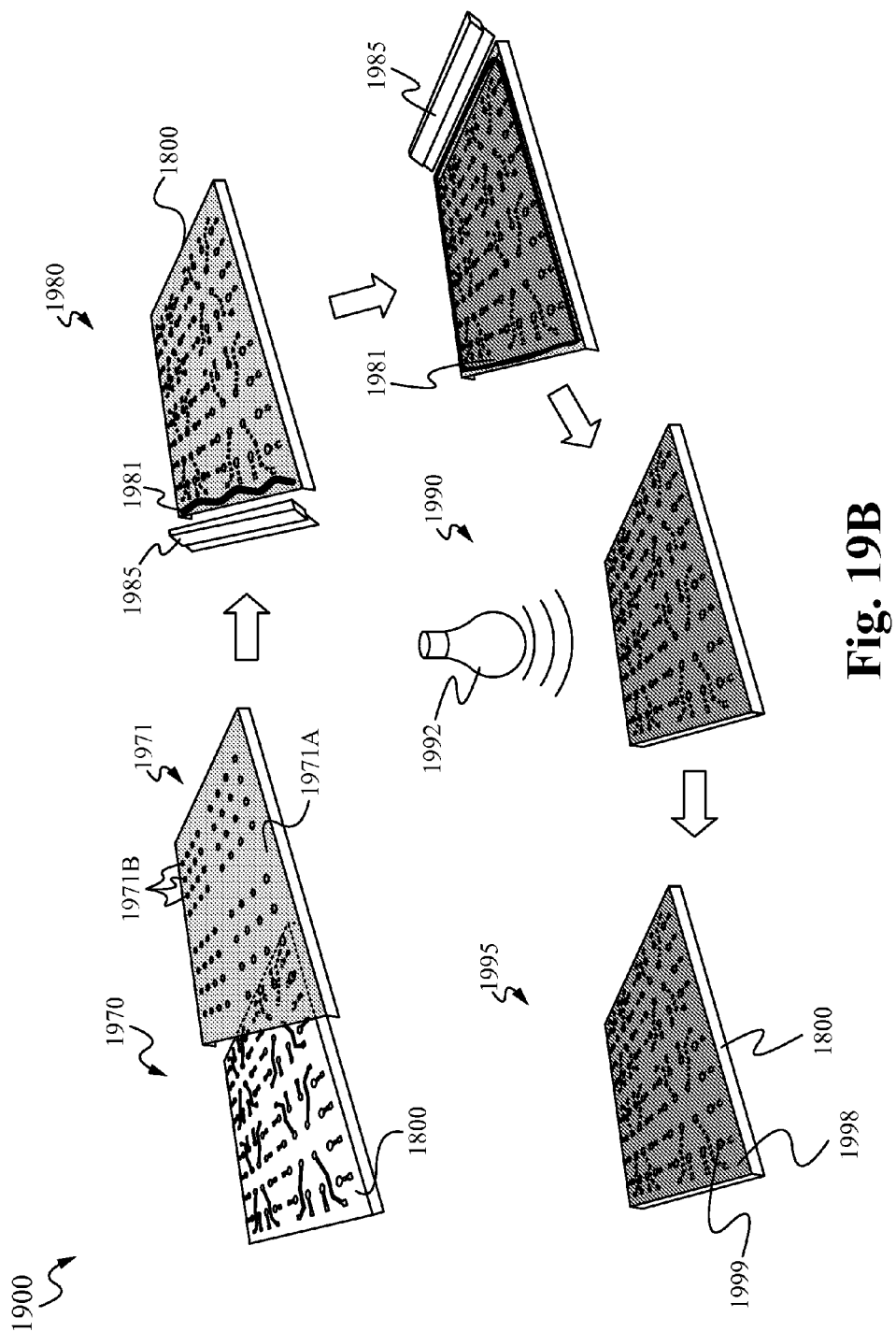
FIG. 19B illustrates a portion of a process of making the semiconductor package per an embodiment of this invention.

In some embodiments, the process moves on to FIG. 19B. Although a single semiconductor package 1800 is shown, the person of ordinary skill having the benefit of this disclosure will appreciate that the semiconductor packages are still in matrix form as in FIGS. 18 and 19A. FIG. 19B shows the semiconductor package 1800 of FIG. 18 having a solder resist epoxy applied thereon. In a step 1970, a screen stencil 1971 is placed over surface of the semiconductor device 1800 having the contact traces thereon. The screen stencil 1971 has a permeable area 1971A that is permeable by a liquid substance and an impermeable area 1971B that is impermeable by a liquid substance. Preferably, the impermeable area 1971B is arranged such that it falls on the second ends of the contact traces 1835 of FIG. 18. In a later step 1980, solder resist epoxy 1981 is placed at one end of the semiconductor package 1800 and is smeared across the semiconductor package 1800 by a trowel 1985. The impermeable areas 1971B prevent the solder resist 1981 from coating the second ends of the contact traces 1835 of FIG. 18. In a later step 1990, a UV cure light 1992 cures the solder resist epoxy. What results in a step 1995 is a semiconductor package 1800 having a solder resist epoxy layer 1998 having openings 1999 for placing solder bumps or solder balls as explained further below.

Figure 20A:
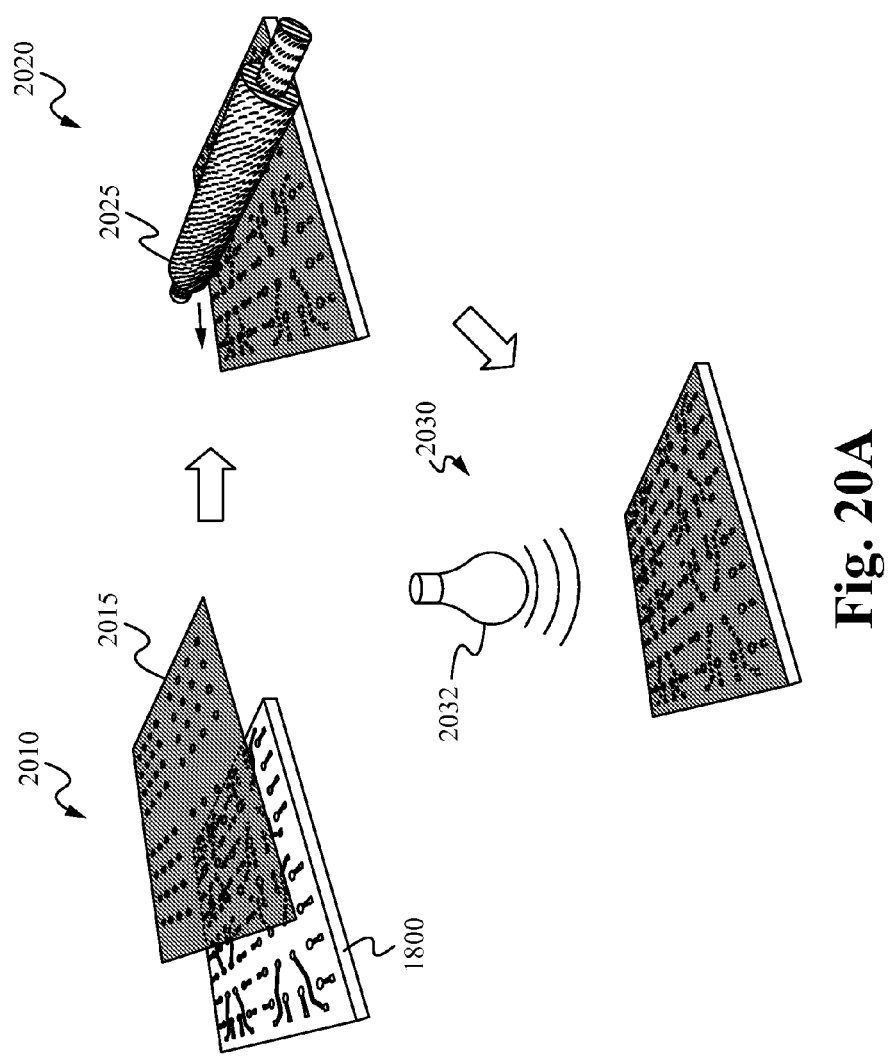
FIG. 20A illustrates a portion of a process of making the semiconductor package per an embodiment of this invention.
Figure 20B:
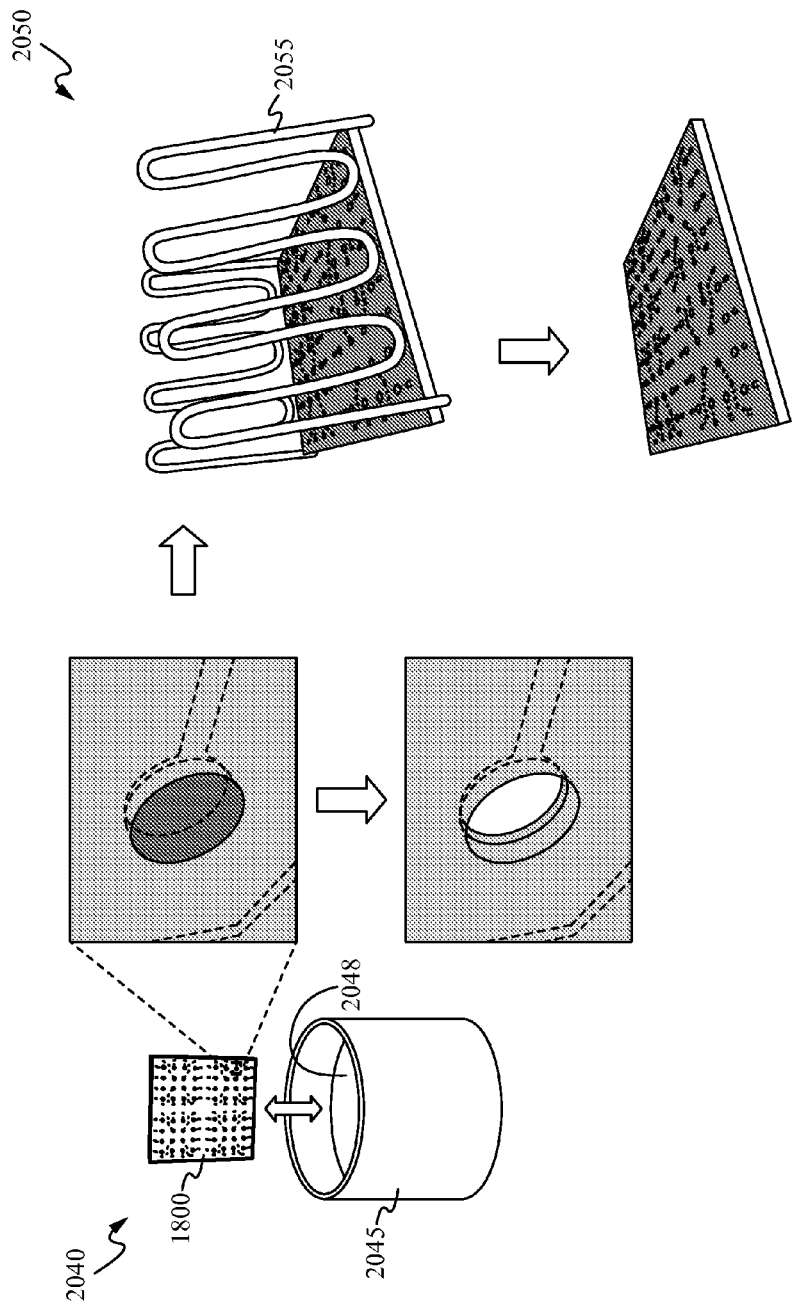
FIG. 20B illustrates a portion of a process of making the semiconductor package per an embodiment of this invention.

In FIG. 20A, the semiconductor package 1800 is shown having a solder resist film applied thereon. The solder resist film 2015 is shown being lowered onto the semiconductor package 1800 in a step 2010. In a later step 2020, the solder resist film 2015 is applied to the semiconductor package 1800 by some means for applying pressure. In the example of FIG. 20A, a rolling pin 2025 is shown. Those of ordinary skill having the benefit of this disclosure will recognize several means and methods of applying the solder resist film 2015 onto the semiconductor package 1800. In a later step 2030, the solder resist film 2015 is cured by UV light from a UV light source 2032. The process continues in FIG. 20B. In a step 2040, the semiconductor package 1800 is dipped into a vat 2045 having etching material 2048. During exposure to the development material 2048, portions that are uncovered by the solder resist film 2015 are exposed to the etching material 2048. After exposure, those portions are removed. In a later step 2050, the solder resist film 2025 is cured. In the example provided, heating elements 2055 provide heat for the curing step, other means for curing are also possible.

Figure 21A:
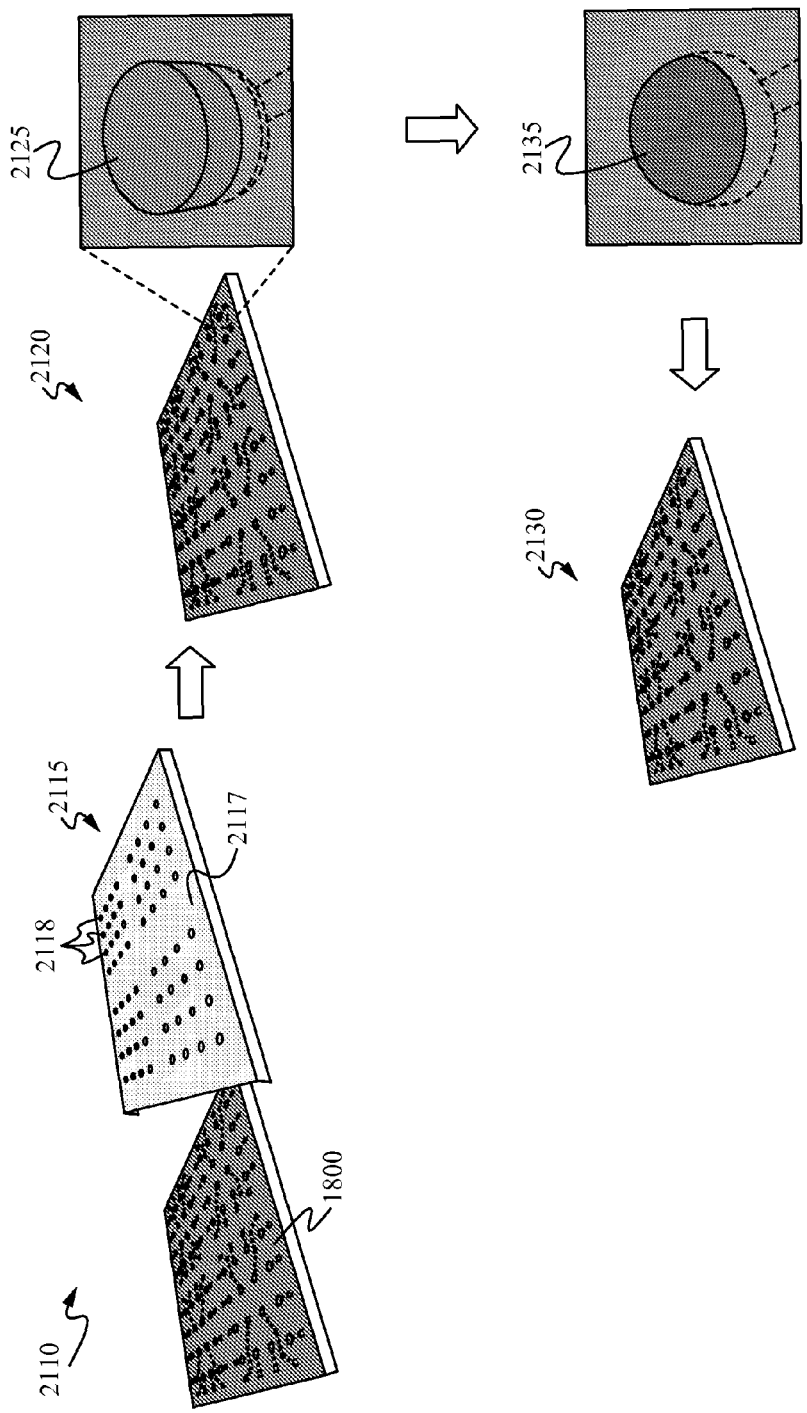
FIG. 21A illustrates a portion of a process of making the semiconductor package per an embodiment of this invention.

FIGS. 21A and 21B show exemplary process steps of attaching solder bump balls to the semiconductor package per an embodiment of this invention. FIG. 21A shows the process steps of implementing a screen for applying solder bump balls. In a step 2110, a screen is placed over the semiconductor package 1800. The screen 2115 has a solid metal area 2117 that is impenetrable by liquid solder, and an array of openings 2118. Preferably, the openings 2118 are positioned such that when the screen 2115 is placed over the semiconductor device 1800, the openings 2118 coincide with the second ends of the contact pads 1835 of FIG. 18. In a later step 2120, solder paste is applied. In some embodiments, the solder paste is in mix of solder and flux. The solder paste rolls off the solid metal area 2117 and settles in the portions left bare by the openings 2118. What results is a solder paste bump 2125 that is electrically coupled to the second end of the contact trace 1835 of FIG. 18. In a later step 2130, heat is applied to the solder paste bumps 2125, causing the flux within the solder paste to flow away, and the solder paste bump 2125 melts and assumes a round shape. What results is a solder bump ball 2135. The solder bump ball 2135 serves as an adhesive and a means for forming an electrical contact with an end application, such as a printed circuit board. FIG. 21B shows an alternate process for forming solder bump balls. An extruder 2145 drops solder flux 2147 into the areas not covered by the solder resist film 2025 of FIGS. 20A and 20B. As described above, these portions coincide with the second ends of the contact traces 1835 of FIG. 18. Then, solid solder balls 2155 are placed above the solder flux 2147. In one exemplary method, the semiconductor package 1800 is agitated or vibrated while solder balls are poured upon the surface having the solder resist film 2025. Eventually, all the portions having solder flux 2147 are filled with a solder ball 2155 when the solder ball 2155 becomes stuck in the solder flux 2147. In a later step 2160, the solder balls 2155 are exposed to heat, forcing out the flux 2147 and causing the solder balls to melt and assume a form fitting shape into the open portions. Finally, in a singulation step 2170, a saw 2175 separates the matrix and an individual semiconductor package 1800 is formed.

VII. Support Structures

Figure 22:
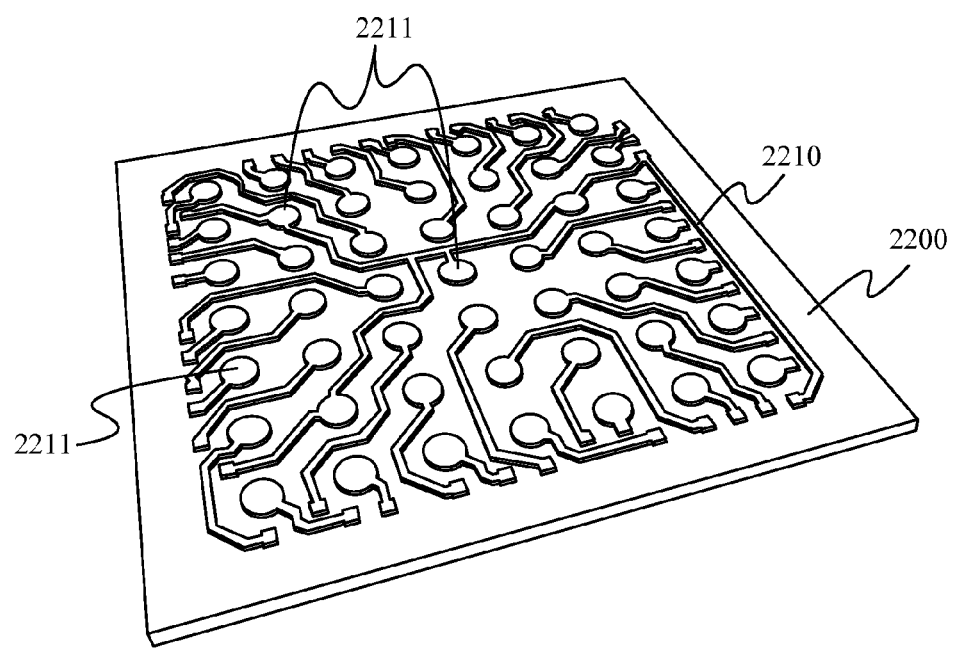
FIG. 22 shows a plated leadframe per an embodiment of this invention.

As discussed above, current technologies require a large number of I/O available for a semiconductor device. Semiconductor packages having a greater number of I/O, or contact points, have been developed. However, with increased number of I/O comes an increase in the form factor. To that end, a high density plated pattern of contact traces per an embodiment of this invention is shown in FIG. 22. A metal substrate 2200, such as copper, has several contact traces 2210 plated thereon by a process such as the one described in the above Figures. The contact traces 2210 have several end points 2211 for providing multiple external contacts. This allows for greater density of I/O in a final application. However, the contact traces 2210, may peel lead to the contact traces 2210 peeling from the semiconductor package as the package is heated during the reflow steps mentioned above or when the semiconductor package is heated during a later mounting step.

Figure 21C:
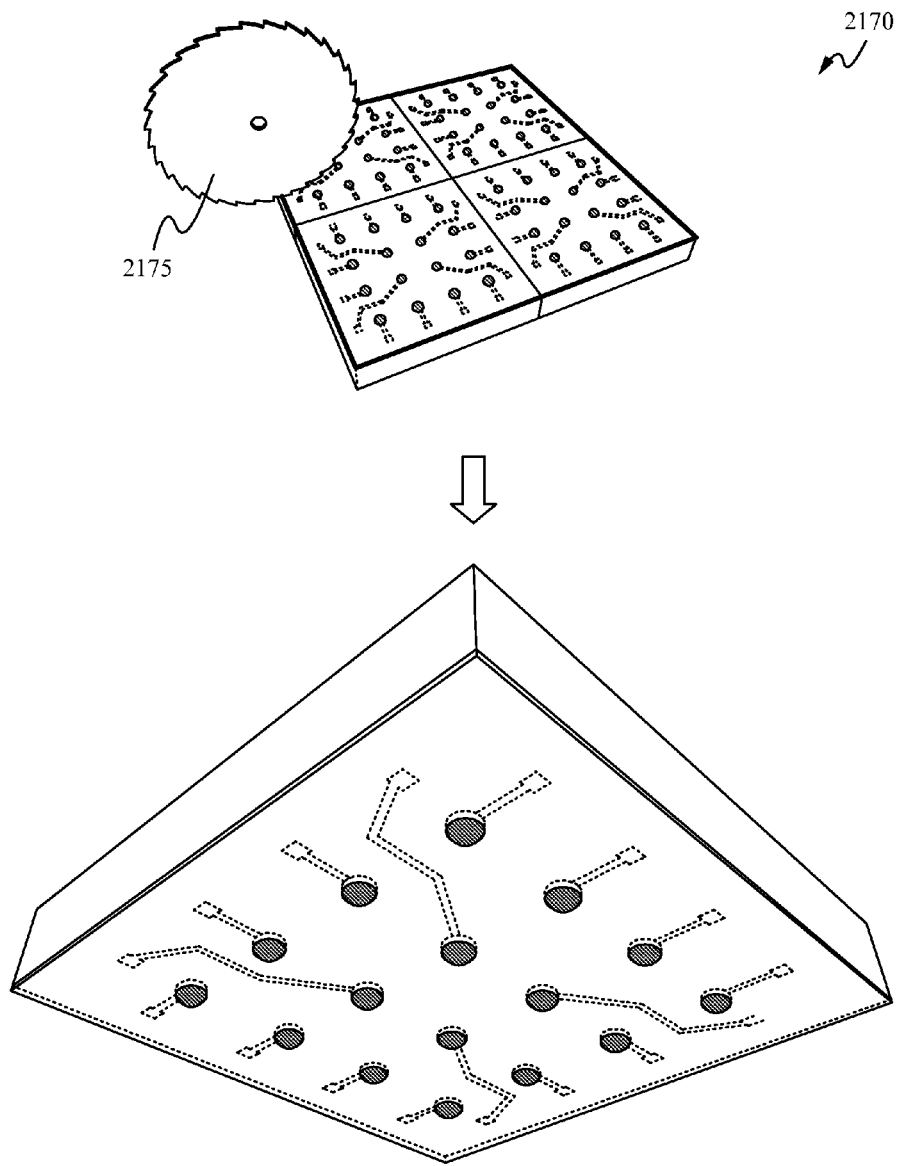
FIG. 21C illustrates a portion of a process of making the semiconductor package per an embodiment of this invention.
Figure 23:
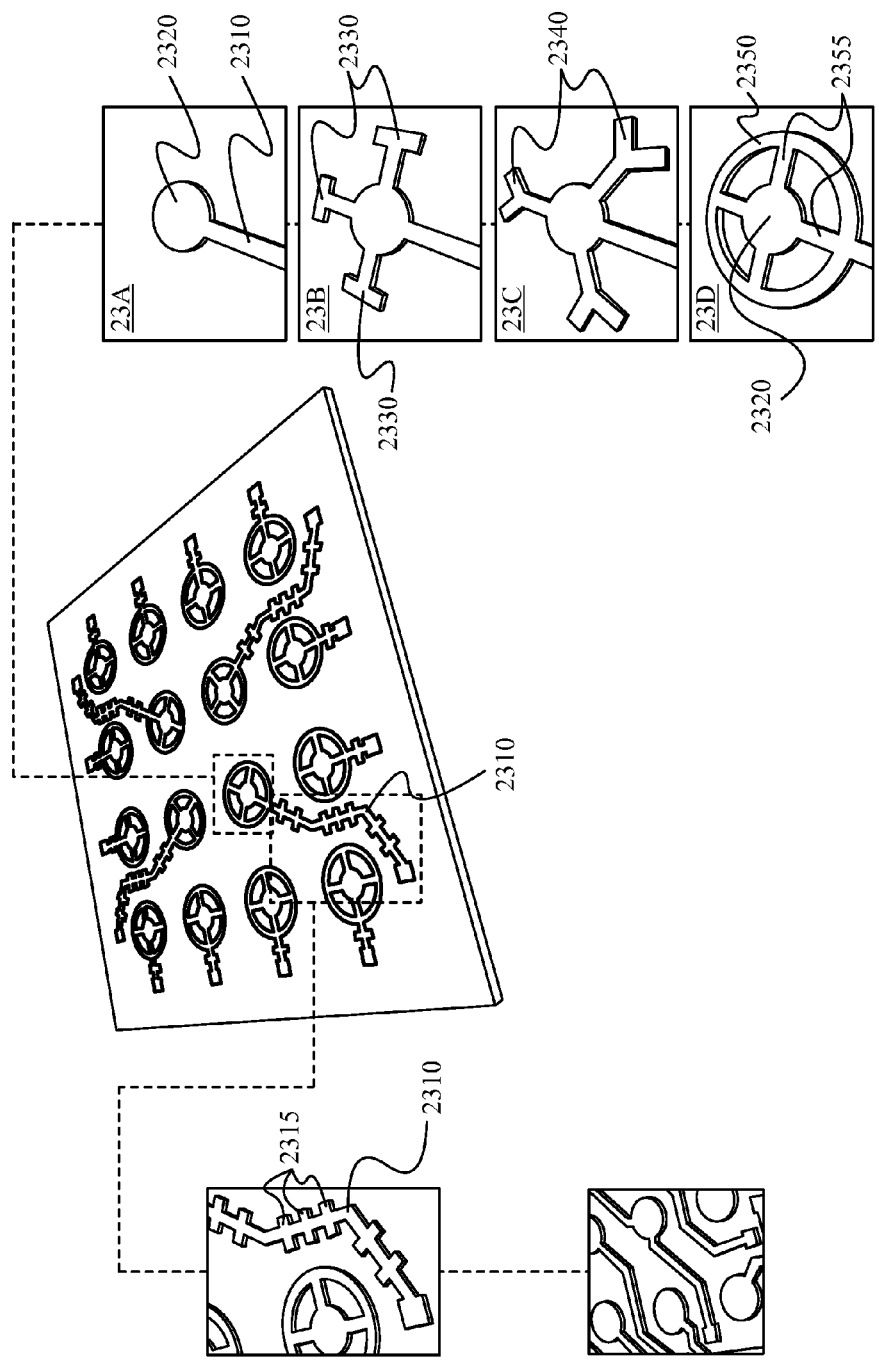
FIG. 23 shows platted leadframes having support structures per an embodiment of this invention.

FIGS. 23-23D show the traces 2210 and end points 2211 of FIG. 21 having various support structures to reduce peeling during process steps in manufacturing and application that involve heating the semiconductor package. FIG. 23 shows one embodiment wherein the perimeter of the contact trace 2310 comprises several support structures 2315 emanating outward therefrom. The support structures 2315 increase the adhesion of the contact traces 2310 to the eventual semiconductor die when it is completed. In the example provided, the support structures 2315 are represented as generally rectangular protrusions integrated with the contact trace 2310. However, the person of ordinary skill having the benefit of this disclosure will recognize that many shapes can be used as applications require. The shape should be chosen, among other factors, according to how densely the contact traces 2310 are placed and the size of the semiconductor die that is to be used. The shapes can have linear features, such as the rectangles shown, or arcuate features, such as half circuits, ovoids, or any other rounded shape. FIGS. 23A-23D show exemplary support structures for the ends of the contact traces. FIG. 23A shows a bare contact trace end 2320, similar to the second end 1835 of FIG. 18. In some applications, an enlarged area at the end of the contact trace 2310 suffices as a support structure to prevent peeling. In the embodiment shown, the enlarged area is bulbous and round, but as mentioned above can take any appropriate shape for a particular application. FIG. 23B shows three additional support structures emanating from the contact end 2320. The exemplary shapes of the support structures 2330 are linear in nature and form three Ts. The embodiment of FIG. 23C shows "Y" shapes for the support structures 2340. Although a greater area consumed by the support structures 2340 can further reduce the likelihood of peeling, the greater area also reduces the available surface area for a maximum density of the contact traces 2310. To that end, FIG. 23D shows an arcuate support structure 2350. Advantageously, the arcuate support structure 2350 provides more surface area for contacting the mold compound (not shown) and thereby providing greater adhesion. In the example shown, the support structure 2350 completely circumscribes the contact trace end 2320 and is integrated by tying bridges 2355. However, the arcuate support structure 2350 can also be shaped such that it partially circumscribes the contact trace end 2320. Advantageously, all of these support structures mentioned can be plated along with the contact traces 2310 in the same process steps as described in the previous Figures. The plating patterns discussed above, such as in step 1920 of FIG. 19 can be altered to include the support structures. As a result, no additional process steps are needed to include the support structures, and only an incremental increase in materials. As a result, any cost increase due to the support structures will be insignificant.

Figure 24:
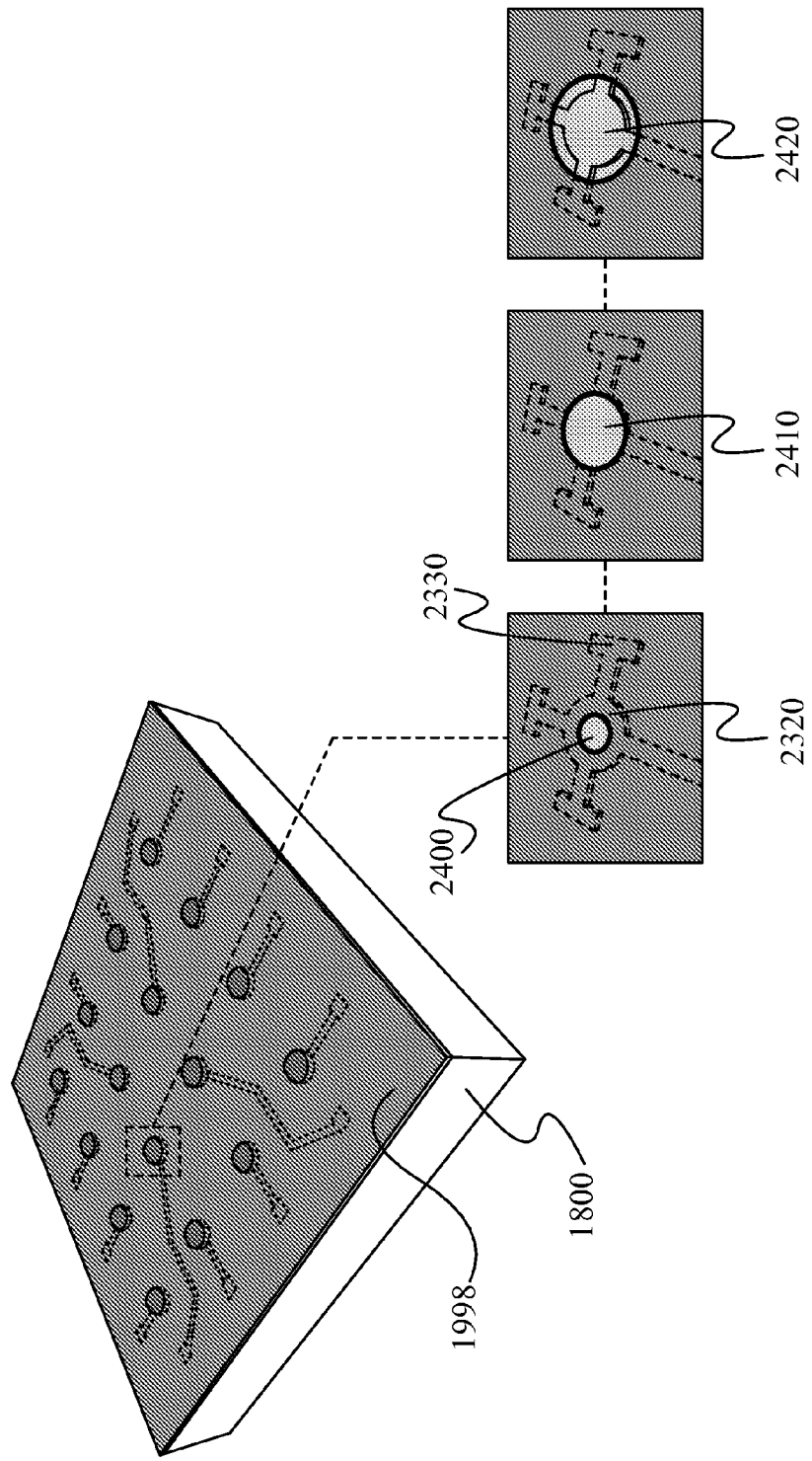
FIG. 24 shows a sealant or passivation layer over a leadframe per an embodiment of this invention.

In general, end manufacturers that use semiconductor devices in packages such as the one described in the above drawings have a certain pitch requirement between contact traces and the ends of the contact traces. In general, a semiconductor package has solder bumps or balls mounted on a surface that contacts an end application, such as a printed circuit board. The semiconductor package is heated to melt the solder which then makes a physical and electrical connection with the end application. However, end users' manufacturing tolerances vary widely, and as a result some minimum distance, or pitch between the contact traces or their ends is specified by the end user. As can be seen from the embodiments of FIG. 23, the support structures can cause the contact traces and their ends to be closer together. The solder flux screening methods shown in FIGS. 19B-20B preferably have openings (such as 1999 of FIG. 19) that conform to the pitch requirements of an end user. FIG. 24 shows the semiconductor device 1800 having the solder resist layer 1998 (from FIGS. 18 and 19, respectively). As an example, the support structure 2330 of FIG. 23B is shown under the solder resist layer 1998. Although a solder resist layer is shown and discussed herein, those of ordinary skill having the benefit of this disclosure will readily recognize that other passivation means and methods can be employed to form an electric separation between the semiconductor die 1800 and an end application or to form a barrier to solder. The opening 2400 in the solder resist layer can be made smaller than the end of the contact trace. Alternatively, another opening 2410 is shown being the same size as the end of the contact trace 2410. Still alternatively, the opening 2420 can be larger. In some embodiments, the size of the openings 2400, 2410, and 2420 is determined by the pitch requirement of the end user.

VIII Plated Ball Grid Array with Standoffs

Figure 25A:
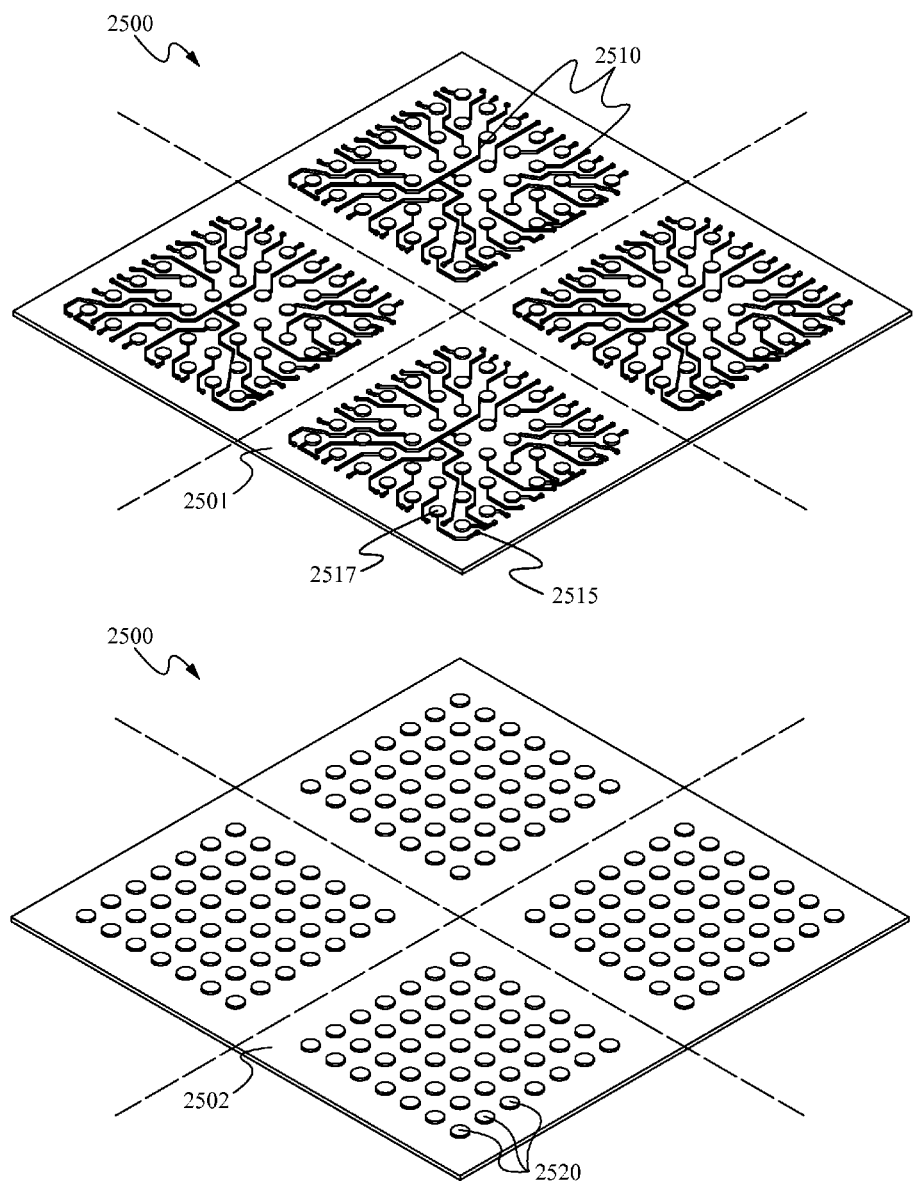
FIG. 25A shows a copper substrate having both sides plated.

As described above, in some applications it is desirable to have a thin package that has some standoff distance between the package and the PCB. As the number of I/O, or contact pads increase, mounting the packaged semiconductor device can become difficult. Standoffs effectuate easier mounting and provide greater reliability and contact. FIG. 25A shows a monolithic metal substrate 2500. The substrate 2500 is essentially a thin, unbroken sheet of metal. In the example provided herein, copper is the chosen metal for the substrate 2500. However, the person of ordinary skill having the benefit of this disclosure will readily appreciate that many different metals can be used based upon their amenability to plating and ease of etching. In the example of FIG. 25A shows processing steps in matrix form, i.e. several semiconductor devices before singulation. In later figures, method steps and apparatus are shown interchangeably in matrix form and in singulated form. It is generally understood that most processing steps for the semiconductor packages described herein are performed while in a matrix form, with singulation coming as a last step before packing and shipping. The top surface 2501 of the substrate 2500 has a first pattern 2505 plated thereon. The first pattern 2505 defines a plurality of routing traces 2510. Each routing trace 2510 comprises a first contact point 2515 and at least one additional contact point 2517. In general, the first contact point 2515 is of an appropriate size to receive a wirebond for electrically coupling a semiconductor die (not shown) to the one or more additional contact points 2517 via the routing traces 2510. The routing traces 2510 are disposed such that when the semiconductor die is mounted, at least some of the routing traces 2510 and additional contact points 2517 lie under the semiconductor die. Such an arrangement allows for increased contact point density thereby effectuating greater I/O in the smallest possible form factor. On a back side 2502 of the substrate 2500, a second pattern is plated. The second pattern 2507 is an array of plated contact points 2520. In this embodiment, the second pattern is plated such that the plated contact points 2520 correspond with the additional contact points 2517 on the first side 2501 of the substrate 2500. In a later processing step, when the substrate 2500 is removed, portions of the substrate 2500 that fall between the first plated pattern of routing traces 2510, first contact points 2515, and additional contact points 2517, and second plated pattern of plated contact points 2520 will be preserved, thereby forming standoffs.

Figure 25B:
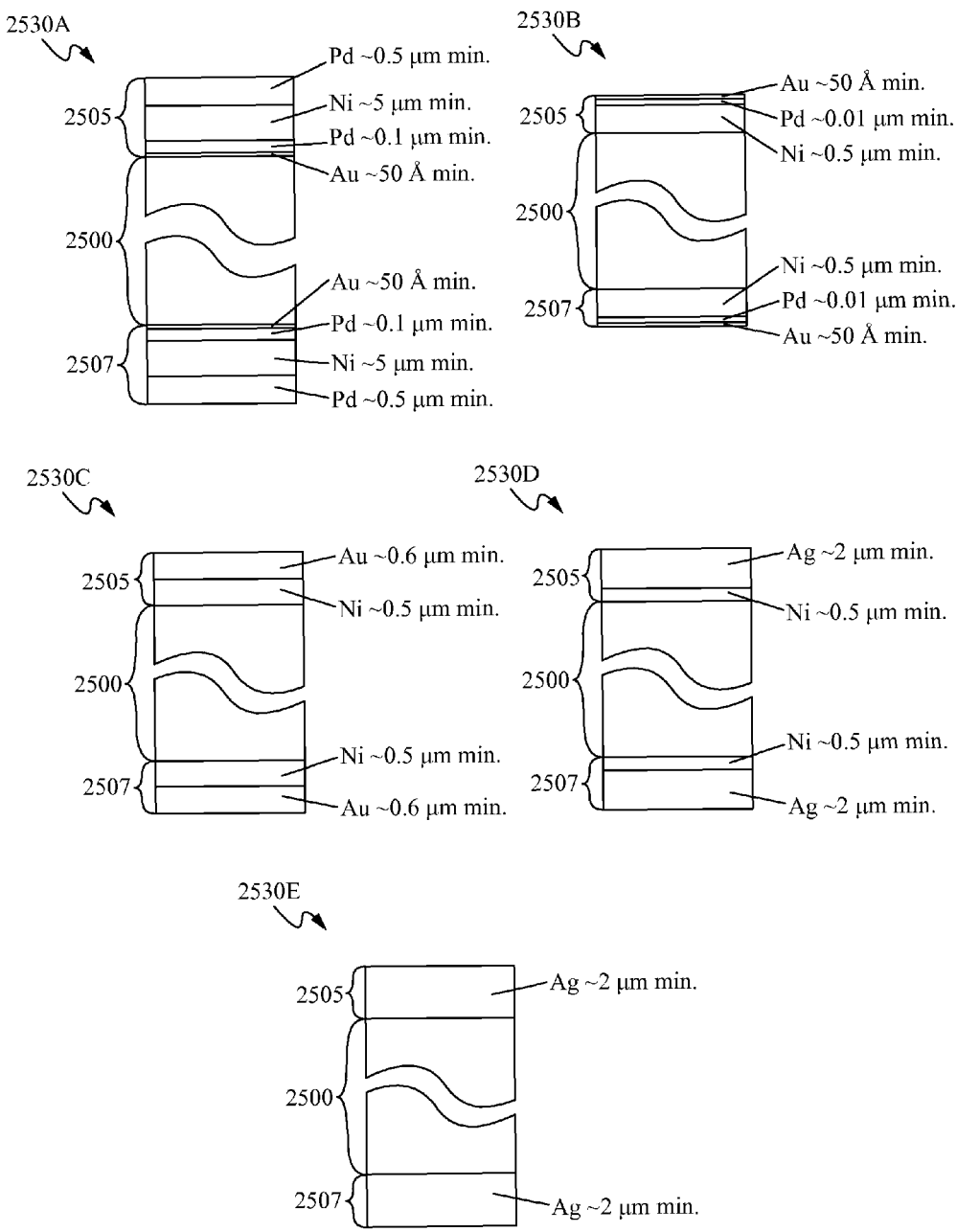
FIG. 25B shows exemplary plating layers upon a substrate.

FIG. 25B shows several exemplary plating options in cross section. The thicknesses of the individual plated layers are not necessarily to scale, but are presented to show approximate ratios of one layer to another. The options can be chosen based on specific design requirements, such as current handling capability, reliability, or any other consideration. The first example 2530A shows the copper substrate 2500 with the first pattern 2505 on a top surface and a second pattern 2507 on a bottom surface. The first layer of plating on both sides of the substrate 2500 is a 50 angstrom layer of gold. Then, a 0.1 um layer of palladium is plated, then a 5 um layer of nickel, then a 0.5 um layer of palladium. The second option 2530B shows the substrate 2500 plated on both sides first with a 0.5 um layer of nickel, then a 0.01 um layer of palladium and finally a 50 angstrom layer of gold. Another example 2530C shows a 0.5 um thick layer of nickel and a 0.6 um thick layer of gold on either side of the substrate 2500. Advantageously, each plated layer requires only one masking and plating step. If a single plated layer is desired on either side, the entire plating process can be achieved in one step. As discussed above in the background section, some prior art solutions have differing plated layers on a top surface and a bottom surface of a substrate. Necessarily, such solutions require at least one additional plating step to achieve the different layers. The person of ordinary skill having the benefit of this disclosure will readily appreciate that any combination of desirable plating materials can be used.

Figure 25C:
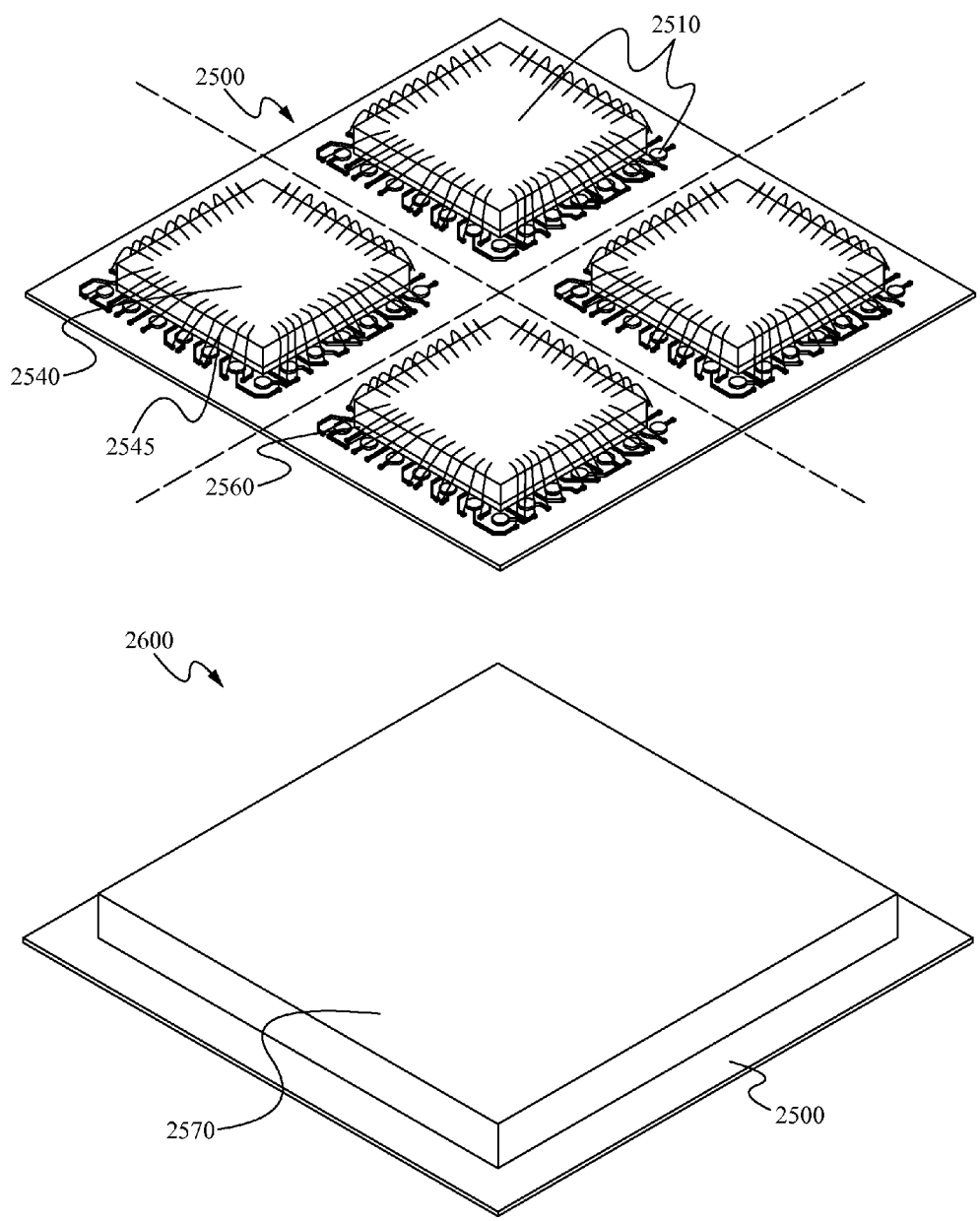
FIG. 25C shows the copper substrate with die and wirebonds attached and molded.

FIG. 25C shows the substrate 2500 having semiconductor die 2540 mounted thereon. Preferably, an adhesive 2560 is used to attach the die 2540 to the top surface 2501 of the substrate 2500. The adhesive 2560 should be a thermally conductive and electrically insulative material. Wirebonds 2545 are mounted from the die 2540 to each of the first contact points 2515. In some embodiments, not all of the first contact points 2515 are used. The substrate 2500 is then encased in a mold compound 2570 thereby forming a molded substrate 2700.

Figure 25D:
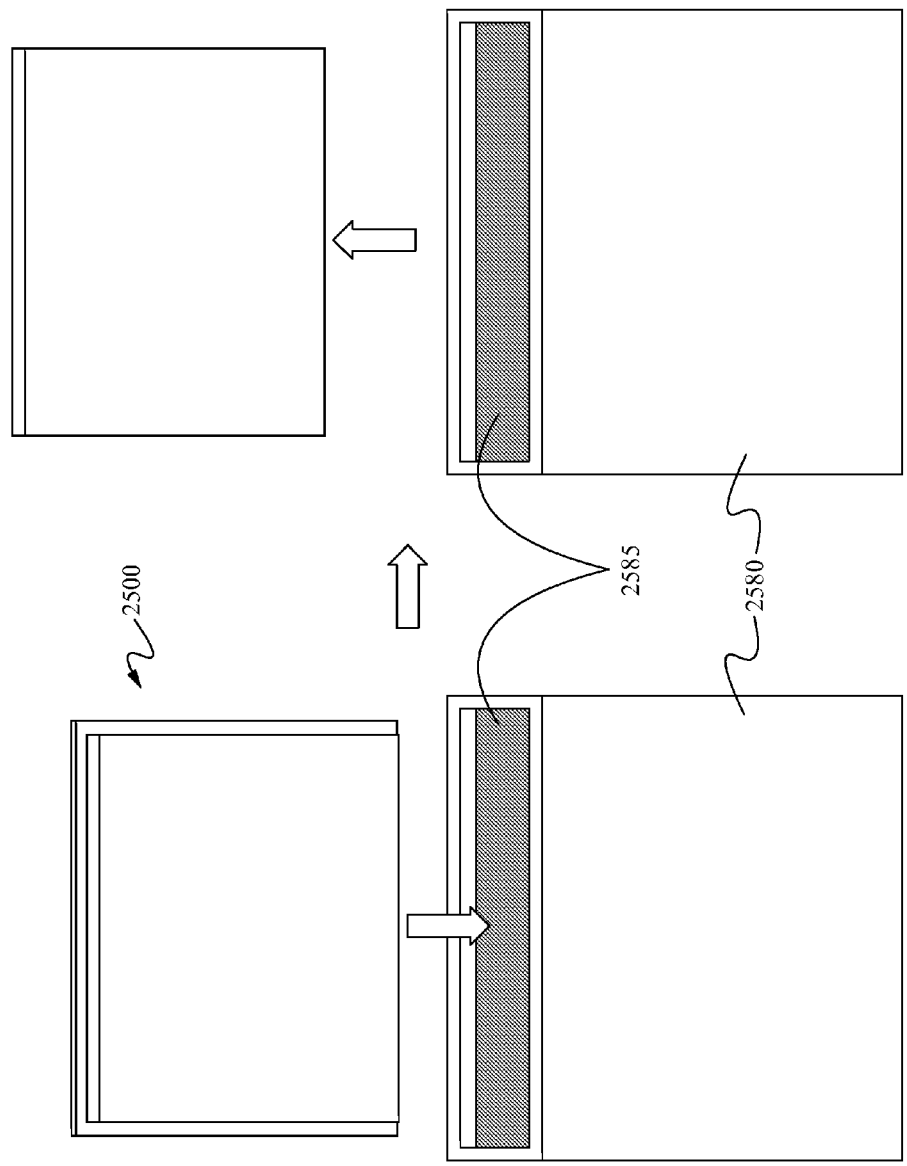
FIG. 25D shows the molded substrate being etched.

In FIG. 25D, the molded substrate 2600 is shown being lowered into an etching solution 2585 in a vat 2580 and removed. The etching solution 2585 is chosen such that it etches the metal that the substrate 2500 is formed from, but leaves intact the plated patterns. As a result, substrate material, in this example copper, that is between the plated patterns will remain while all other substrate material will be sacrificed. In some embodiments, the sacrificed copper, or any other substrate material, can be reclaimed by later wet chemistry processes. Although the substrate 2500 is shown being submerged into a vat 2580, the substrate 2500 can be exposed to etching solution 2585 in any number of ways, including but not limited to complete submersion, overhead spray on a conveyor belt, or the like.

Figure 25E:
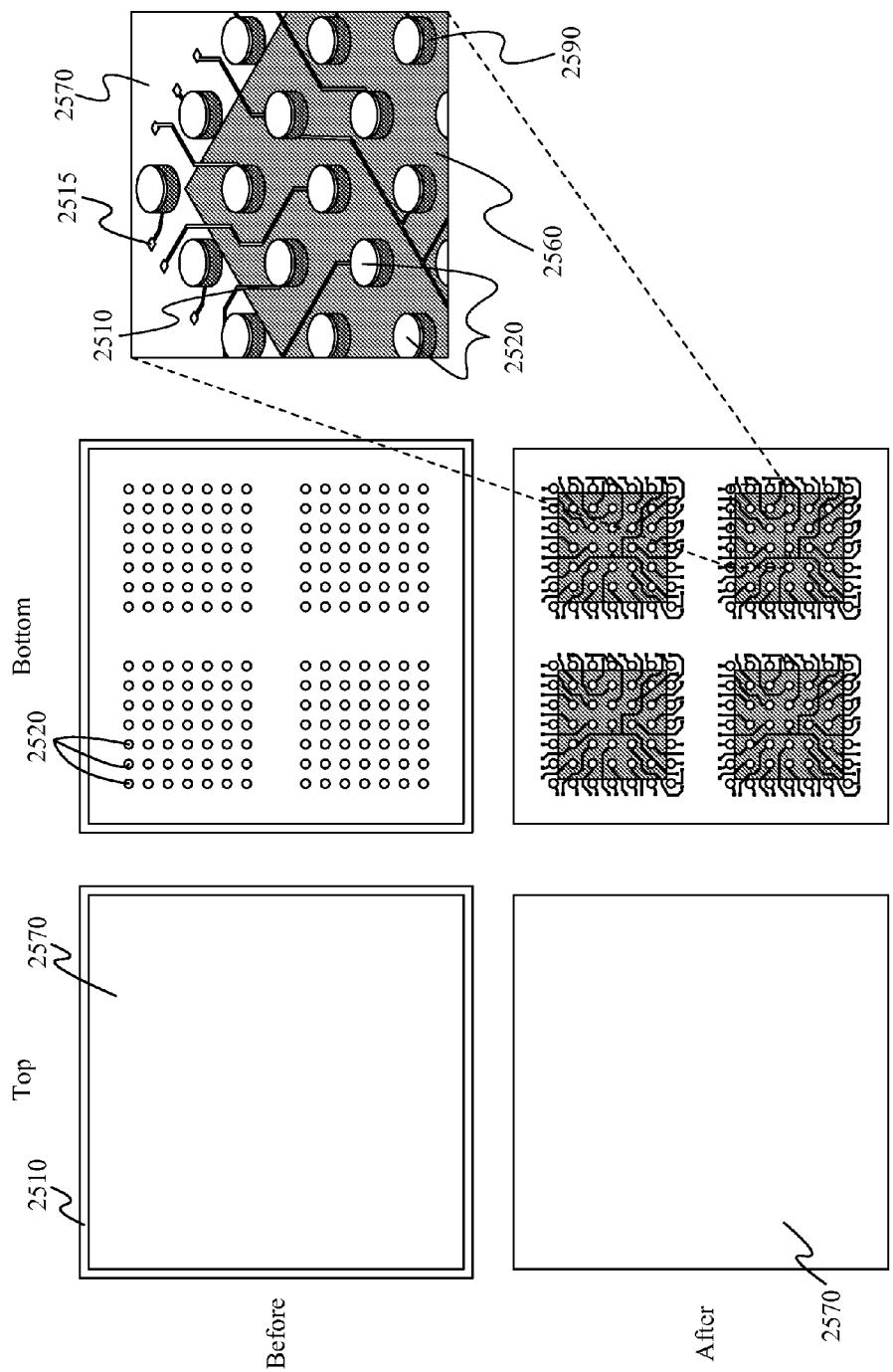
FIG. 25E shows the top and bottom surfaces molded substrate before and after the etching process.
Figure 25F:
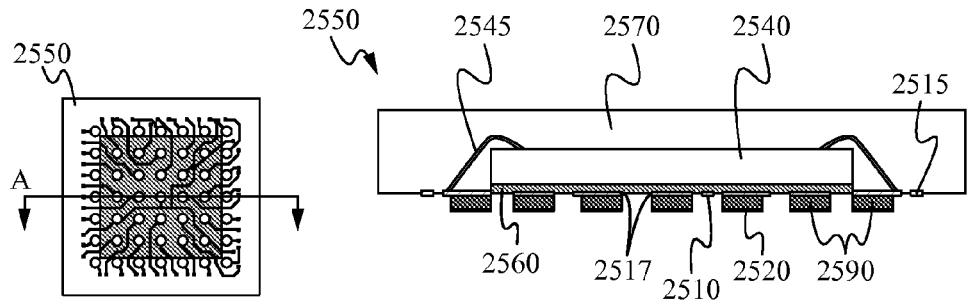
FIG. 25F shows a singulated semiconductor device per an embodiment of this invention in cross section.

FIG. 25E shows the results of the etching process of FIG. 25D. Before the etching process, only the plated contact points 2520 are visible from a bottom view as the substrate 2500 is intact. From a top view, the mold compound 2570 and substrate 2500 are visible from a top view. After etching, only the mold compound 2570 is visible from a top view since the substrate 2500 has been sacrificed. From a bottom view, the routing traces 2510 are now exposed. Advantageously, the routing traces 2510 are not affected by the etching solution and as a result form an electrical pathway from the first contact point 2515 to the additional contact points 2517. A close up of the bottom view shows that the adhesive 2560 is also exposed at a bottom surface. Since the adhesive 2560 is thermally conductive and electrically insulative, it serves a cooling purpose for the semiconductor die (2540, FIG. 25C) as well. As mentioned above, the areas of substrate between the first plated pattern and the second plated pattern remain after the etching process. In the embodiment shown, the only remaining areas of substrate after etching are between the additional contact points 2517 and the plated contact points 2520. As a result, standoffs 2590 are formed. The standoffs 2590 complete an electrical path from the semiconductor die 2540 and wirebonds 2545 of FIG. 25C through the routing traces 2510 to the plated contact points 2520. The standoffs 2590 add height to the finished semiconductor package so that the package stands off from the final application that it is placed in. Advantageously, the standoffs 2590 and the height provided thereby can ease manufacturing tolerances and increase bonding strength. Furthermore, increased current carrying capability and thermal cooling are provided. Although there is no die attach pad as in traditional semiconductor packages, the density of the standoffs 2590 can provide sufficient heat sinking FIG. 25F shows the semiconductor device 2550 of FIG. 25E in cross section bisected along the line A. The semiconductor die 2540 is mounted to an adhesive 2560 which is placed above a first plated pattern. The first plated pattern comprises the routing traces 2510, first contact points 2515 and additional contact points 2517. Seen in cross section, the adhesive layer 2560 is disposed on top of the first plated pattern and the semiconductor die 2540 is disposed on the adhesive layer 2560. Advantageously, high density input/output semiconductor devices are able to be realized since the routing traces 2510 allow for contact points 2510 to be under the semiconductor die 2540, whereas traditional semiconductor devices employ a die attach pad for dissipation of heat or manufacturing ease. When the substrate is sacrificed, portions of substrate material, such as copper, are left between the additional contact points 2517 and the plated contact points 2520. The leftover portions form the standoffs 2590.

Figure 26A:
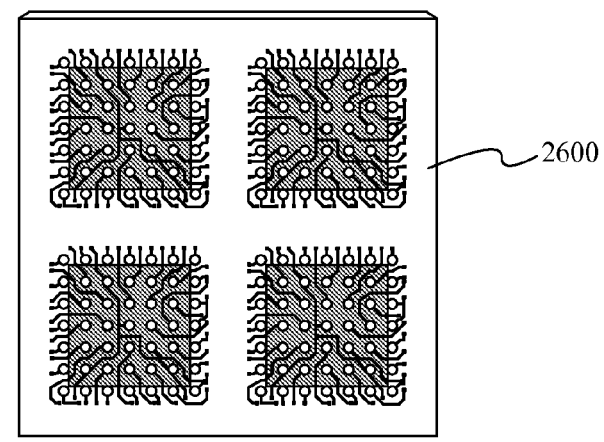
FIG. 26A shows a matrix of semiconductor devices undergoing a metallization process per an embodiment of this invention in cross section.
Figure 26A:
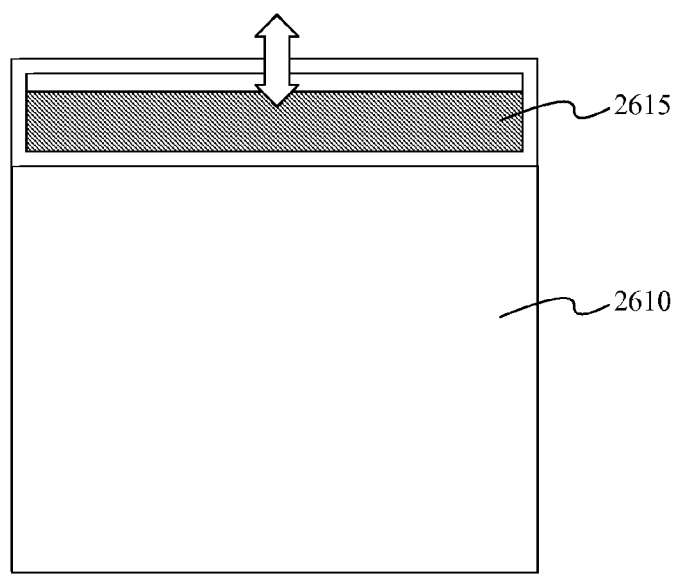
Figure 26B:
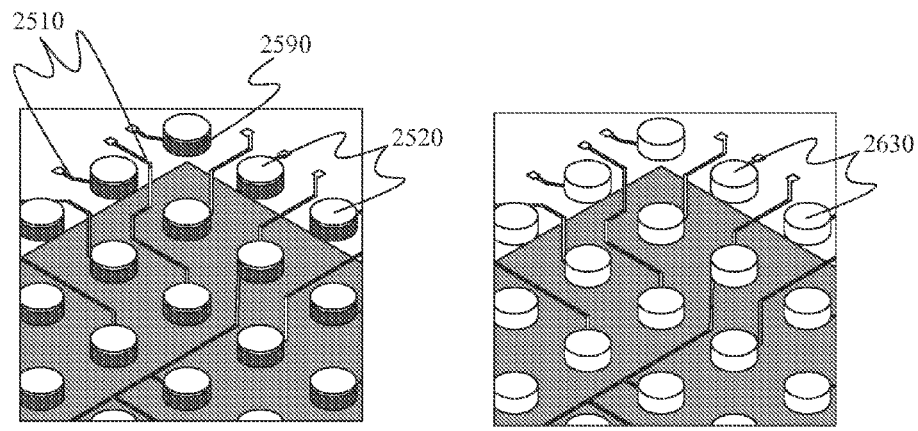
FIG. 26B shows a close up view of a semiconductor package before and after a metallization process.
Figure 26C:
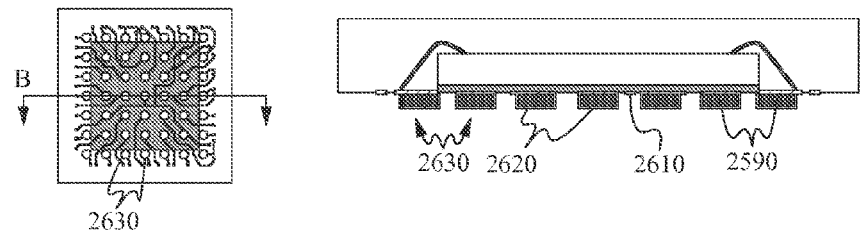
FIG. 26C shows a cross section view of a semiconductor package after a metallization process.

In some embodiments, it is desirable to protect the standoffs 2590 of FIGS. 25E and 25F from corrosion. To that end, a metallization process is shown in FIGS. 26A and 26B. A metallization process is described in U.S. patent application Ser. No. 12/579,574 Filed Oct. 15, 2009 entitled METALLIC SOLDERABILITY PRESERVATION COATING ON METAL PART OF SEMICONDUCTOR PACKAGE TO PREVENT OXIDE and incorporated herein in its entirety for all purposes. In one embodiment, a matrix of devices 2600 are submerged into vat 2610 having a solution 2615 of dissolved metal. A chemical reaction occurs that plates the exposed substrate material, such as copper, with a plating material such as tin. Additionally, the plating material can also plate the bottom surfaces of the exposed routing traces 2510 and bottom surfaces of the plated contact points 2520. When the standoffs 2590 are plated, plated standoffs 2630 are formed. Preferably, the plating material is a low or anti corrosive material so that the semiconductor device can be stored for periods of time without corrosion that can require additional assembly processing steps to remove corrosion before the semiconductor device is mounted into a final application. As mentioned above, the several embodiments of the invention as described effectuate a high density I/O pattern and as a result, small amounts of corrosion can cause a single plated contact point 2520 to not make adequate electrical contact with a final application. However, the metallization process, also known as a metallic solderability preservation process (MSP), enhances corrosion protection in the plated standoffs 2630. Although the matrix 2600 is shown being lowered into a vat 2610 which contains the solution 2615, other methods, such as electroplating, spraying via a nozzle, and other well known or application specific plating methods and apparatus are contemplated. FIG. 26C shows the result of the MSP from a side view of the metallized semiconductor package 2600 bisected along the line B. Plating material 2620, such as tin, has covered the standoffs 2620 to form the plated standoffs 2630. Currently carrying capability and other advantages remain unchanged.

Figure 27A:
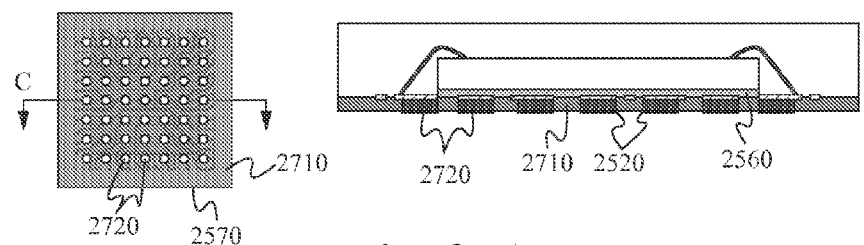
FIG. 27A shows a cross section view of a semiconductor package having an underfill layer.
Figure 27B:
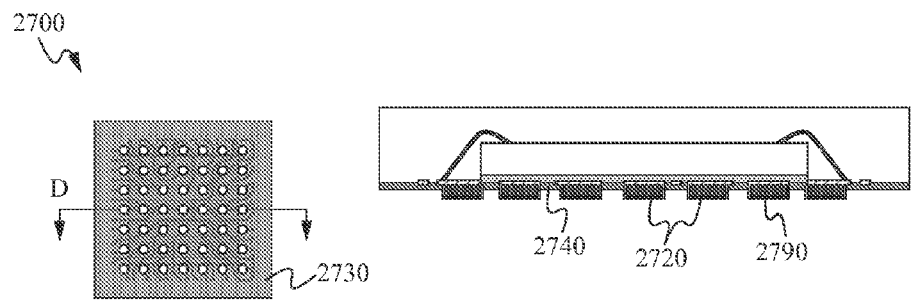
FIG. 27B shows a cross section view of a semiconductor package having a partial thickness underfill layer.
Figure 27C:
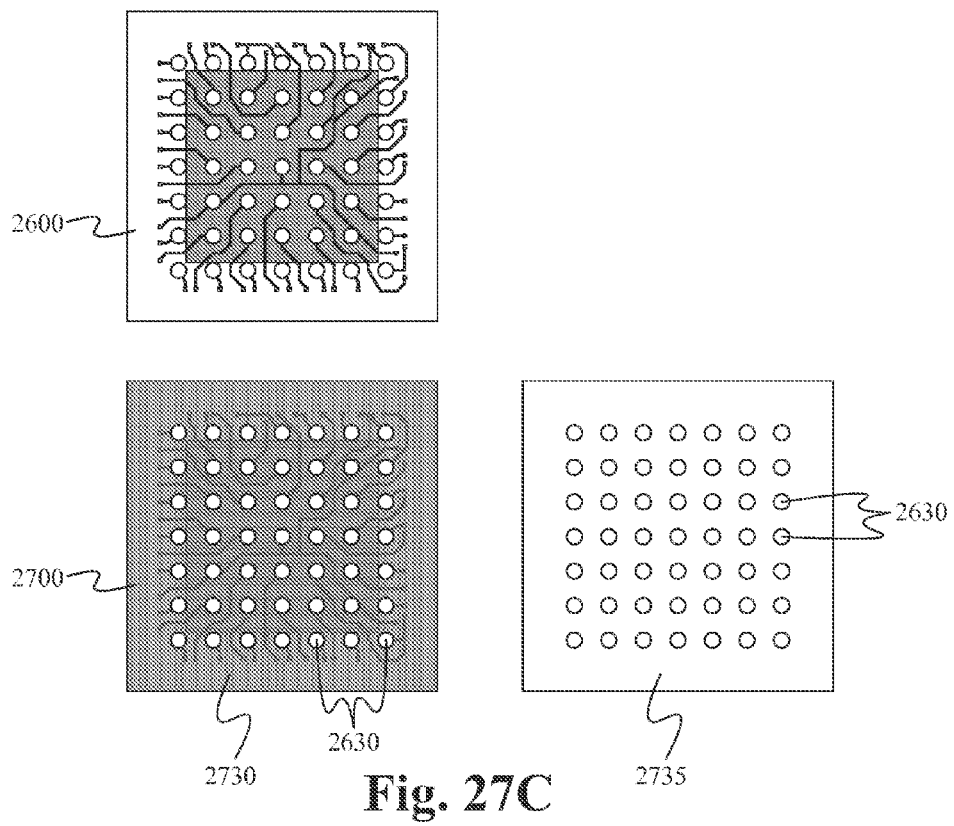
FIG. 27C shows a close up view of a semiconductor package having a partial thickness underfill layer wherein the exposed standoffs are metallized.

FIGS. 27A-27C show embodiments of a semiconductor package having standoffs wherein an underfill layer is introduced. FIG. 27A shows a metallized semiconductor package 2700 bisected along the line C. As in previous embodiments, a semiconductor die 2740 is mounted on an adhesive 2560. In some applications, it is undesirable to allow the adhesive 2560 to be exposed at a bottom surface of the package, as in the embodiment shown in FIG. 25E. To that end, an underfill layer 2710 is introduced. The underfill layer is preferably a thermally conductive and electrically insulative material that fills all spaces between the metallized standoffs 2630 of FIGS. 26B and 26C. For example, the underfill layer 2710 can be silicon dioxide (glass), or a carbide material that is electrically insulative. The underfill layer 2710 serves to enhance the rigidity and shear strength of the semiconductor device 2700 and effectuates a robust coupling with an end application, such as a PCB. In some applications, such as mobile or hand held devices, improved shear strength can be an important feature due to stress tests, such as drop tests, that are performed on mobile or hand held devices. Still referring to FIG. 27A, the plated contact points 2720 are exposed at a bottom surface of the underfill material 2710 so that the semiconductor device 2700 can be soldered into an end application.

In some applications, an underfill layer for rigidity, insulation of the underfill layer, and heat dissipation can be advantageous, but some stand off height can also be desired. FIG. 27B shows a partial underfill layer 2740. The partial underfill layer 2740 extends a partial distance of the standoffs 2790 such that a portion of the standoffs 2790 in addition to the plated contact points 2720 are exposed. The thickness of the partial underfill layer 2740 is an application specific implementation decision that can include such factors as desired increase of shear strength, desired standoff height, desired thermal characteristics, process time, and other factors for particular implementations. FIG. 27C shows the semiconductor device 2600 before an underfill process or metallization process is performed. In one embodiment, metallization occurs after the underfill layer 2740 is deposited. The underfill layer can be deposited by a nozzle, or underfill material in liquid form can be poured across the bottom surface of a matrix of devices 2600. A screen 2735 with a pattern of openings 2630 is placed over the semiconductor device 2700 having underfill such that the openings 2630 coincide with the standoffs 2790. Then, metallization of the standoffs 2790 can be done. Alternatively, the screen 2735 can be placed before the underfill layer 2740 is disposed so that the entirety of the standoffs 2790 are metallized.

Figure 28A:
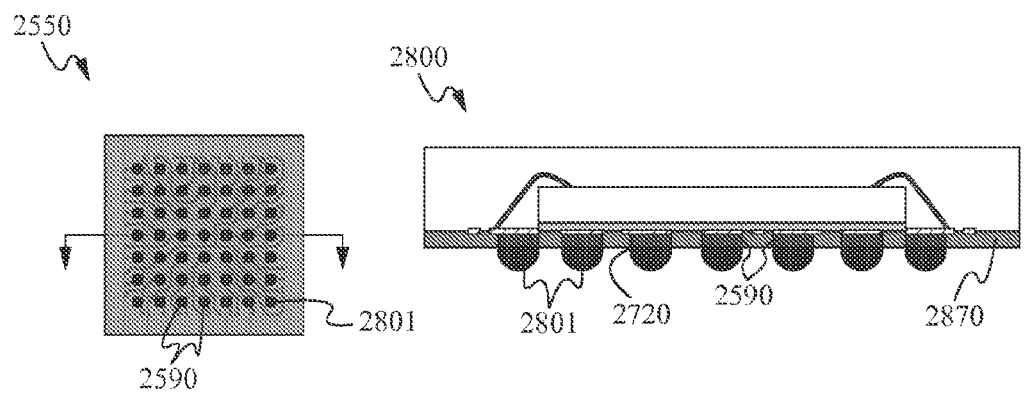
FIG. 28A shows a cross section view of a semiconductor package having solder balls mounted to the standoffs.
Figure 28B:
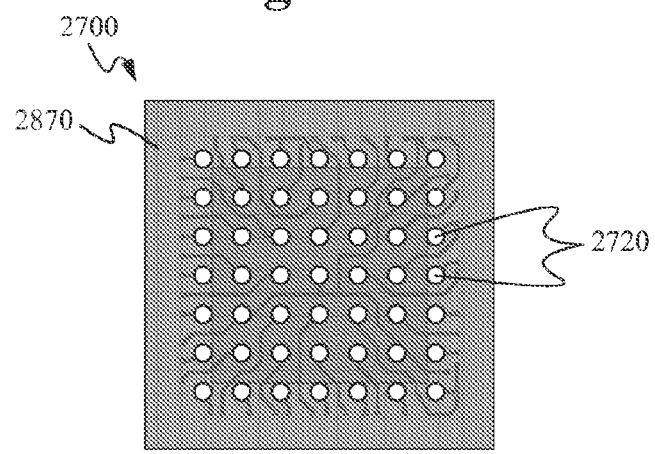
FIG. 28B shows a close up view of a semiconductor package having solder balls mounted to the standoffs.
Figure 28B:
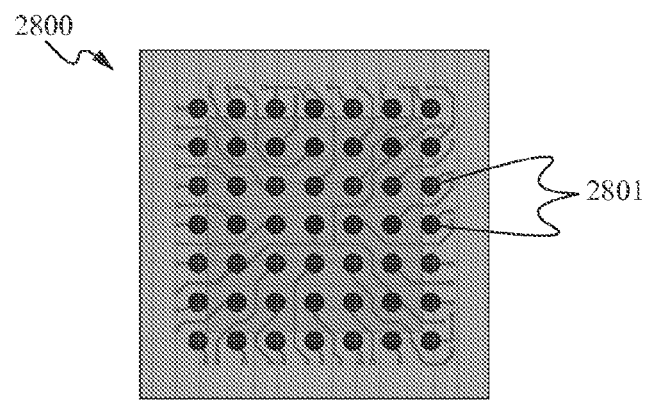

In some embodiments, it is desirable to both have standoff height and a full underfill layer. FIGS. 28A and 28B show a bumped semiconductor device 2800 having an underfill layer 2870 and solder bumps 2801 for providing stand off height. Referring back to FIG. 27A and corresponding text, the plated contact points 2720 are exposed at a bottom surface of the underfill material 2710. Rather than coupling the plated contact points 2720 to an end application, solder bumps 2801 are mounted to the plated contact points 2720. Any convenient method of mounting solder bumps can be used, such as solder reflow, physical attachment, or the like. Advantageously, stand off heigh is achieved while retaining the benefits of the underfill layer described above. FIG. 28B shows a bottom view of the semiconductor package 2700 having an underfill layer 2870 wherein the plated contact points 2720 are exposed. The solder bumps 2801 are mounted to the exposed plated contact points 2720 to form the bumped semiconductor device 2800.

Figure 29A:
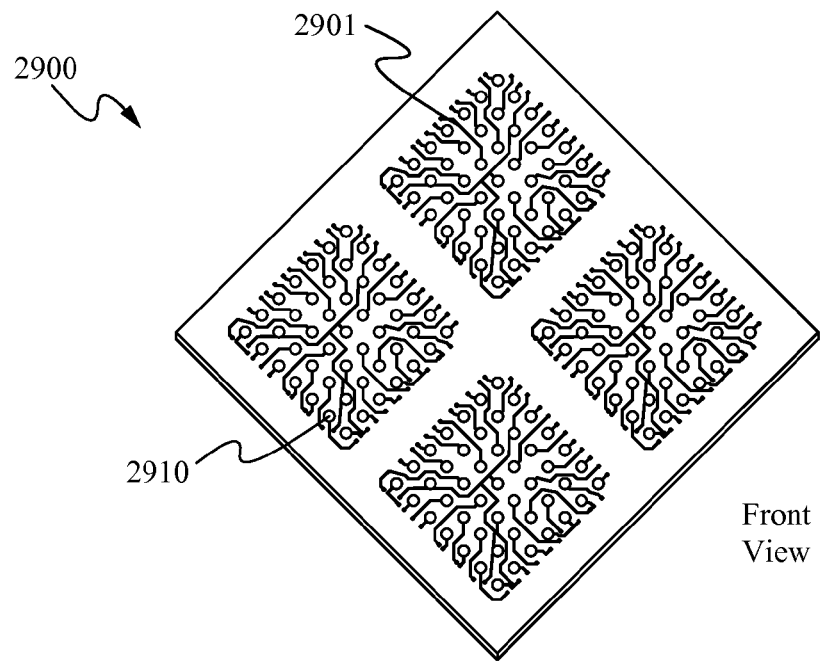
FIG. 29A shows the top and bottom sides of a monolithic copper substrate having an mirror image plating layers on its top and bottom surfaces.
Figure 29A:
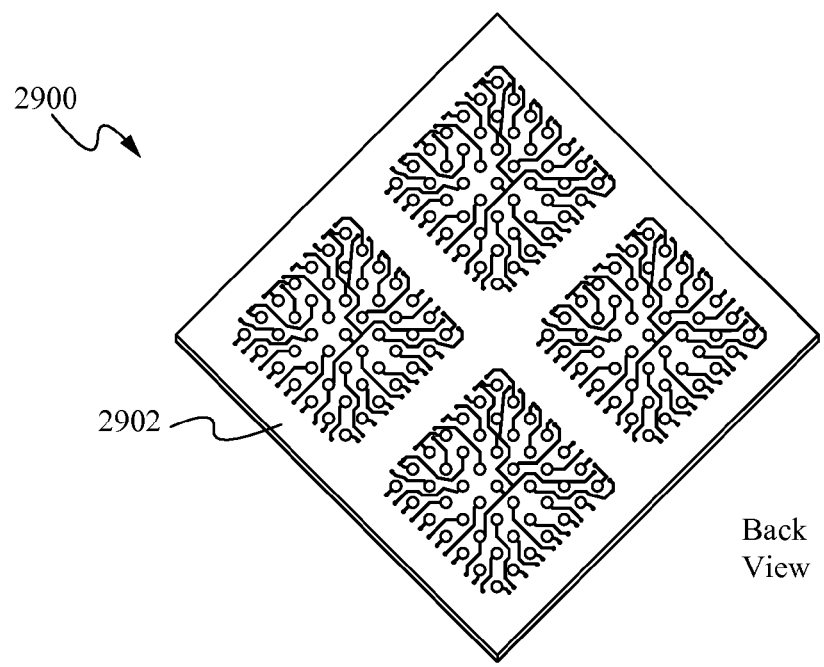
Figure 29B:
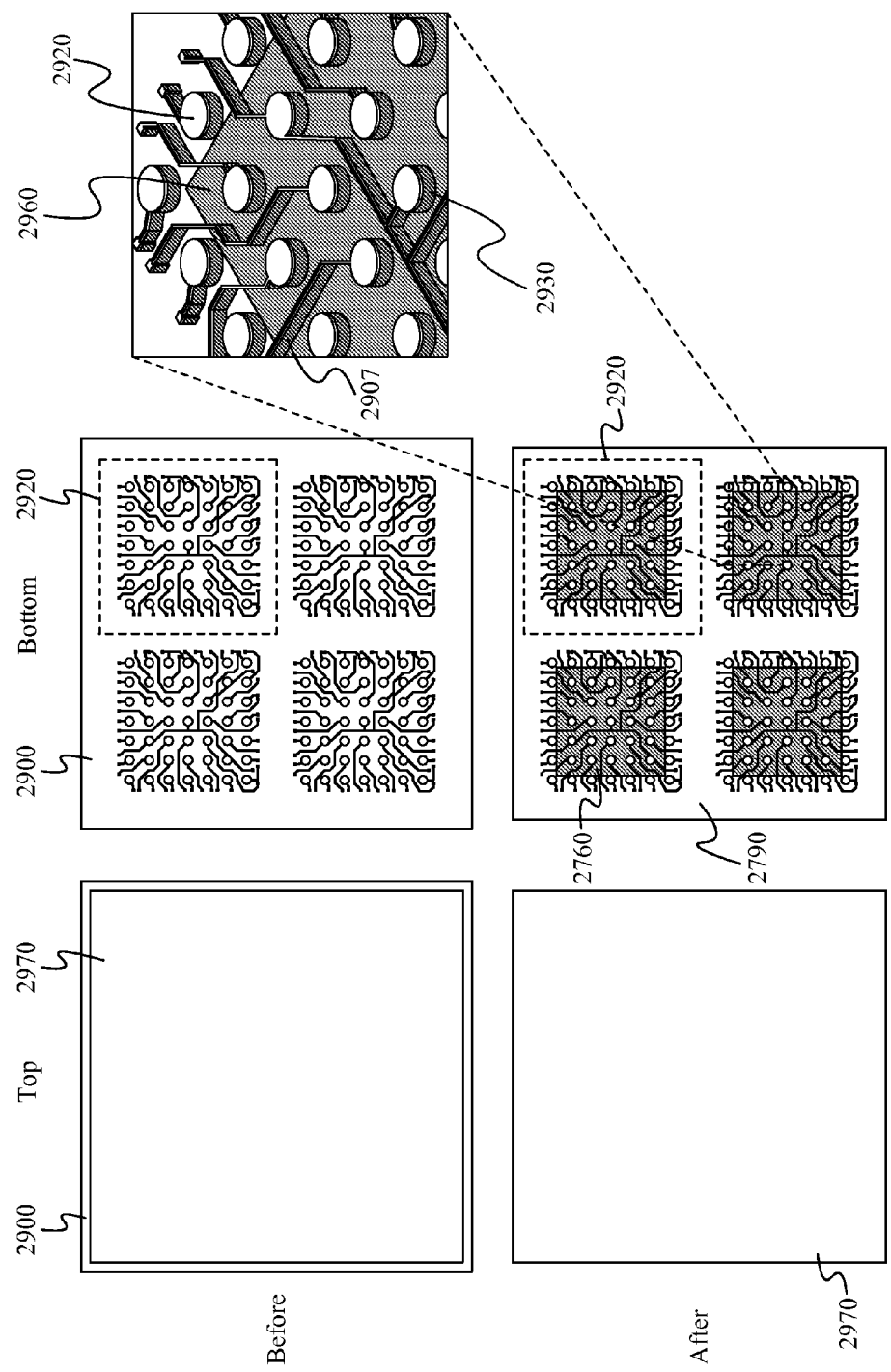
FIG. 29B shows the substrate of 29A before and after an etching process having standoffs that run the length of the routing traces.
Figure 29C:
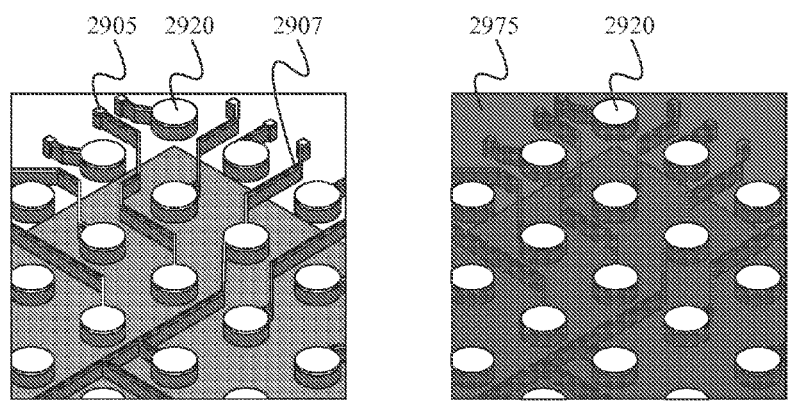
FIG. 29C shows the standoffs of FIG. 29B encased in an underfill material.
Figure 29D:
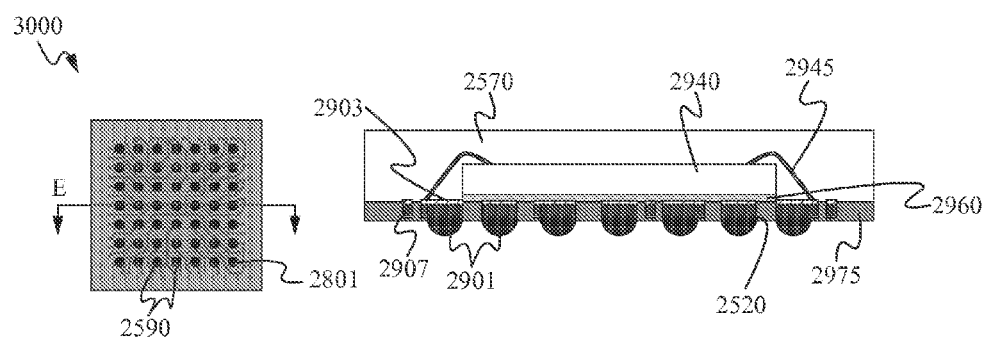
FIG. 29D shows the standoffs of FIG. 29C after solder balls are mounted.

FIGS. 29A-29D show an alternative embodiment of a plated semiconductor package having standoffs and an exemplary manufacturing method. In FIG. 29A, a substrate 2900 is shown in a front view and a back view. On a front view, a first pattern 2901 is plated thereon. In this example, the pattern is identical to the pattern shown in FIG. 25A. On a back surface of the substrate 2900, shown in the back view, mirror image patterns 2902 are plated corresponding to the placement of the first plated patterns 2901. In subsequent processing steps, die attach, wirebonding and molding is done similar to the methods shown in FIG. 25C. Then, the molded leadframe device is exposed to an etching process as described in FIG. 25D.

VIII Standoffs Having Interlocking Features

To make a physical and electrical connection between the package and the terminals (such as the standoffs 2590 of FIG. 25F) and a printed circuit board (PCB), solder paste is generally used. When the package and PCB are processed for reflowing, the solder paste is melted then solidifies to hold the pads of the package to the PCB. During solder freezing, stress forces are introduced between the package and the PCB, thereby putting stress on the terminals. Pull force generated by the freezing of the solder paste can be sufficient to cause the terminals to peel from the body of the package.

Figure 30A:
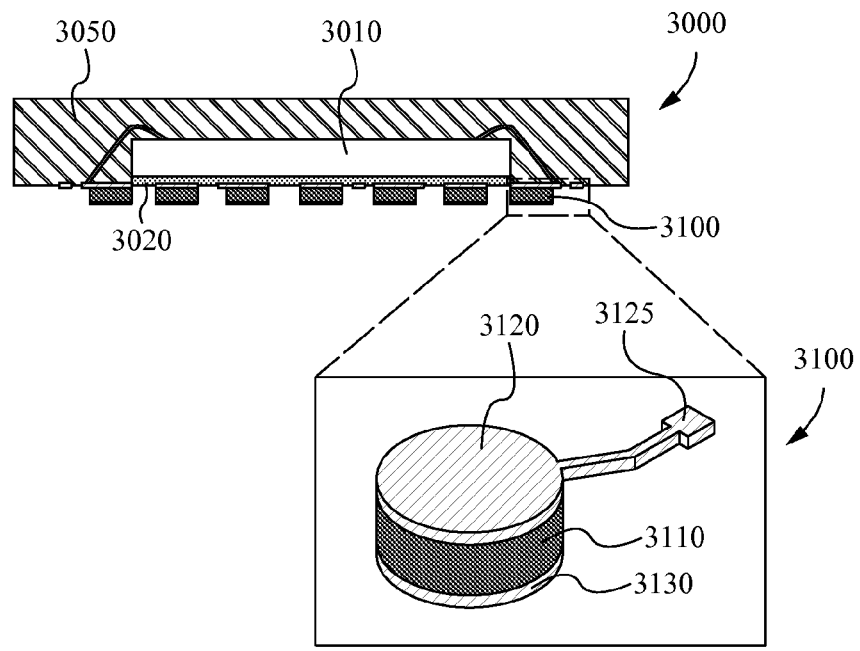
FIG. 30A shows a package having standoff terminals.

FIG. 30A shows a package 3000 having standoff terminals 3100. Some of the standoff terminals 3100 are positioned under the die 3010 and epoxy (or adhesive) 3020 and some are positioned under the mold compound 3050. The closeup of the standoff terminal 3100 shows the copper standoff 3110 plated on a top surface 3120 and a bottom surface 3130. The top surface plating 3120 comprises the circuit trace 3125 formed as described in detail above.

Figure 30B:
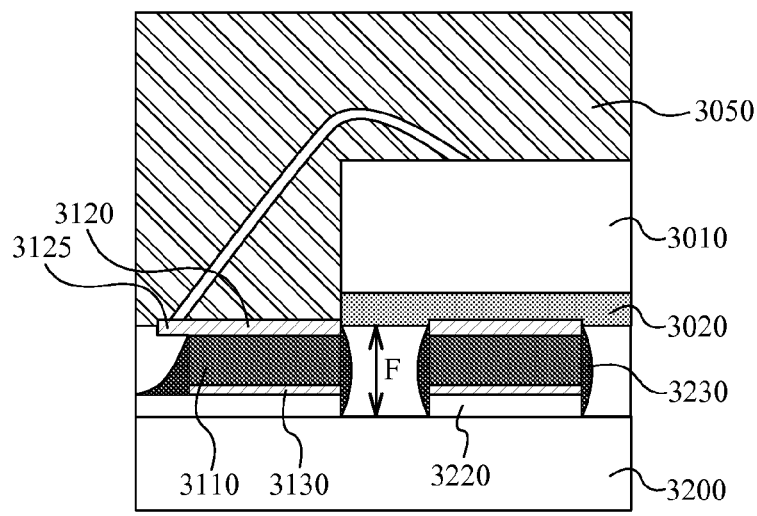
FIG. 30B shows the package mounted to a printed circuit board.

FIG. 30B shows the package 3000 mounted to a PCB 3200. The PCB 3200 comprises circuit traces 3130 of its own. The standoff terminals 3100 make contact with the circuit traces 3220 at their bottom surface plating 3130. Solder paste 3230 is used to form permanent, electrically conductive adhesion. However, as the solder paste 3230 cools and solidifies after a reflow process, Force in the directions F shown in the Figure can cause the standoff terminals 3100 to peel away from the mold compound 3050 or the epoxy 3020. For example, the top surface plating 3120 can peel away from the copper standoff 3110 or the mold compound 3050/epoxy 3020. Increasing the total contact surface area between the standoff terminal 3100 and the mold compound 3050 or epoxy 3020 can provide greater adhesion of the standoff terminals 3100 and thereby can alleviate peel away issues.

Figure 31A:
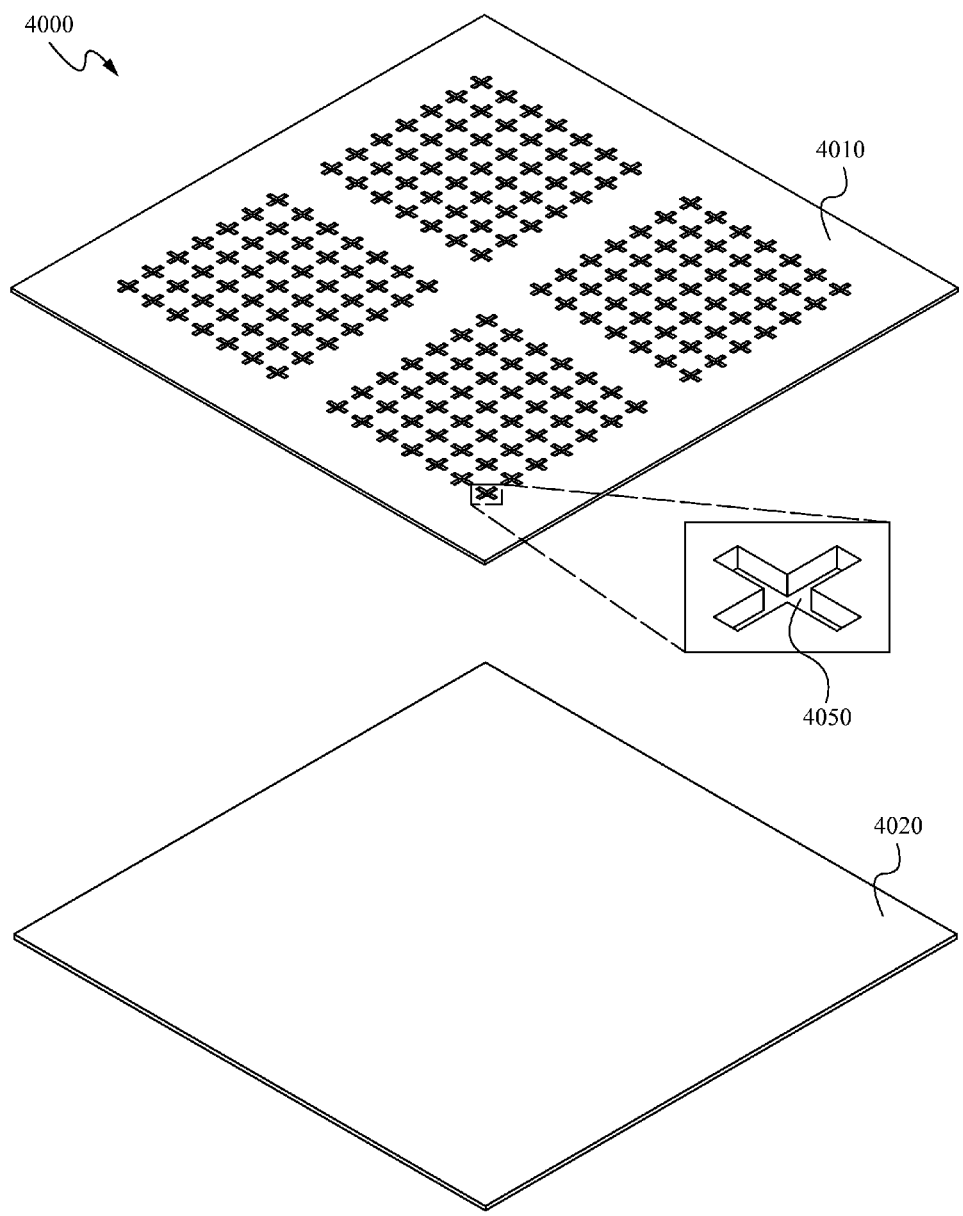
FIG. 31A shows a metal substrate having dimples.

FIGS. 31A-31E show process steps and a resulting semiconductor package having a greater contact area between the standoffs and the body of the package. FIG. 31A shows a metal substrate 4000. Preferably, the metal substrate 4000 is copper, but other materials can be used as applications require. A top surface 4010 of the metal substrate 4000 has a pattern of dimples 4050. In the example of FIG. 31A, there are four patterns of dimples 4050, corresponding to four packages that will be singulated in later processing steps. It is well known that semiconductor packaging is generally done in matrix form. The dimples 4050 are preferably formed by a partial etching process. However, the dimples can be formed in any convenient or application specific way. The top surface 4010 is referred to as such since it the surface where a die will be mounted in a later processing step, rather than indicating a cardinal direction. In the exemplary embodiment of FIG. 31A, the dimple 4050 is an X shape. As will be described below, the actual shape of the dimple 4050 can vary as necessary or as applications require. The bottom surface 4020 is not patterned. In some embodiments, the bottom surface 4020 is left bare.

Figure 31B:
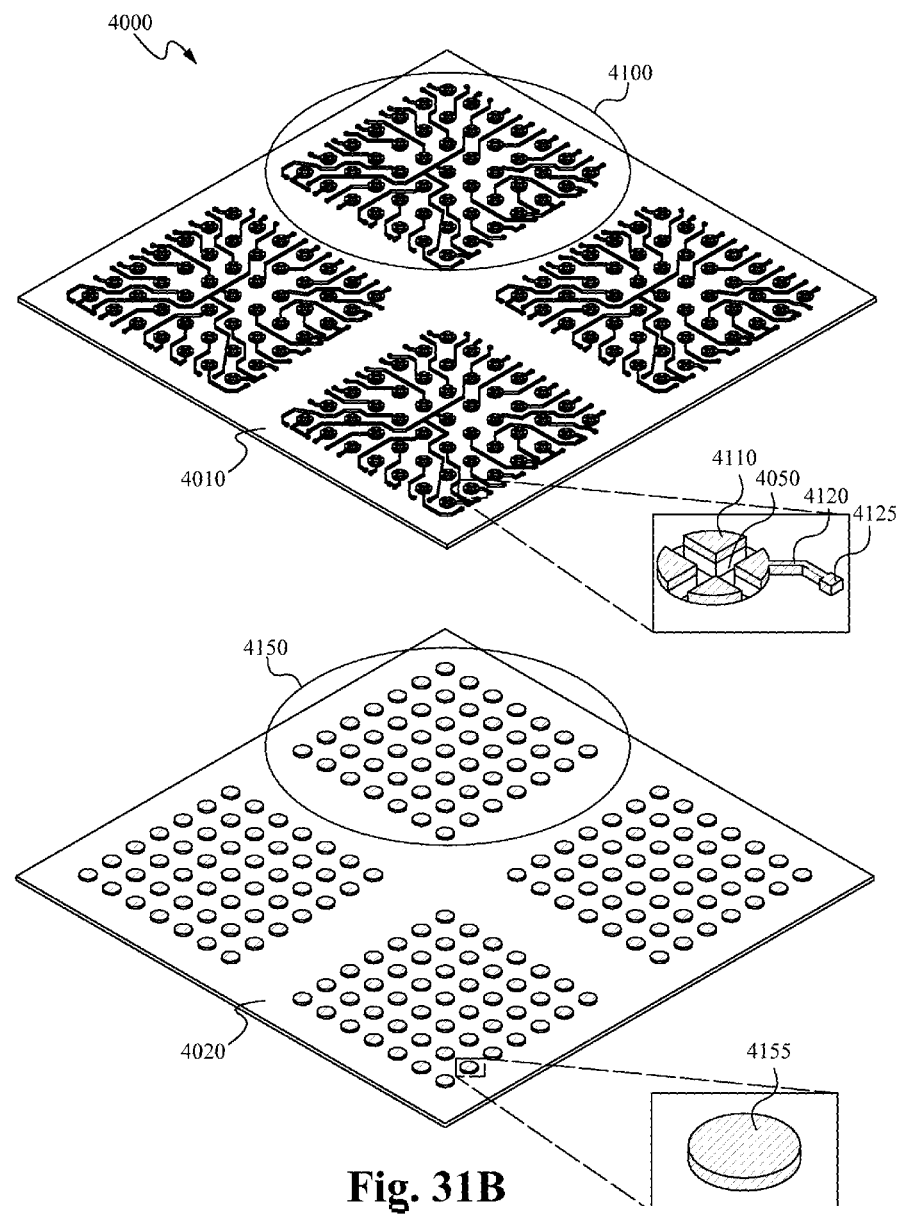
FIG. 31B shows the metal substrate having patterns plated thereon.

FIG. 31B shows the metal substrate 4000 having patterns plated thereon. The top surface 4010 has a first pattern 4100 plated thereon. The first pattern 4100 comprises circuit traces 4120 and contact points 4110 having contacts 4125. The dimple 4050 is left bare in some embodiments. The back surface 4020 of the leadframe 4000 has a second pattern 4150 plated thereon. The second pattern 4150 corresponds to the first pattern 4100. The second pattern 4150 comprises landing points 4155. The shape of the landing pads 4155 are preferably similar to the shape of the contact points 4110. In this example, both the contact points 4110 and the landing pads 4155 are circular, although the contact point 4110 has the dimple 4050. The copper is in between the landing pads 4155 and the contact point 4110 will survive a later etching step and form standoffs. To that end, the locations of the landing pads 4155 should correspond to the locations of the contact points 4110.

Figure 31C:
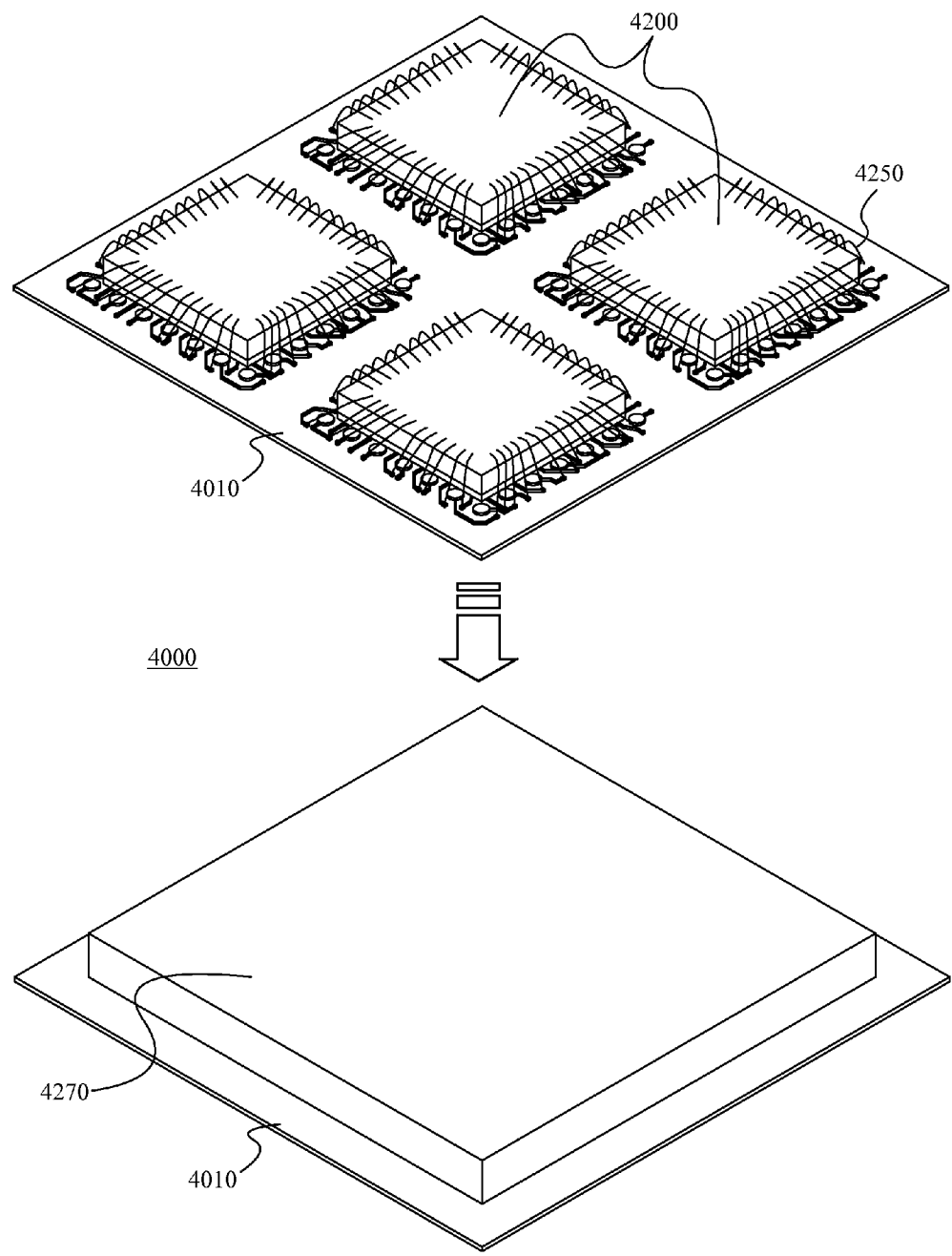
FIG. 31C shows a leadframe having several die mounted thereon and encased in a mold compound.

In a next step as shown in FIG. 31C, the leadframe 4000 has several die 4200 mounted thereon on the top surface 4010. The die 4200 are mounted with their active (e.g. circuit) sides facing away from the leadframe 4000. The die 4200 are electrically coupled to the contacts 4125 by bondwires 4250. Alternatively, the die 4200 can be mounted in a flip chip fashion and can be electrically coupled to the contacts 4125 by solder balls or the like. The die 4200 are mounted to the top surface 4010 of the leadframe by an epoxy (not shown) or other adhesive, such as flexible tape. In embodiments where the die 4200 is mounted in a flip chip fashion, adhesive or epoxy can be injected between the die 4200 and the top surface 4010 and surround the solder balls. The die 4200 and wirebonds 4250 along with the first plated pattern 4100 are encased in a mold compound 4270. As will be explained later, the epoxy (not shown) used to mount the die 4200 to the top surface 4010 and the mold compound 4270 fill into the dimples 4050, thereby increasing the total surface area contact between the eventually form standoff leads and the body of the completed semiconductor package. The metal substrate 4000 is sacrificed in an etching step such as the one shown in FIG. 31D.

Figure 31D:
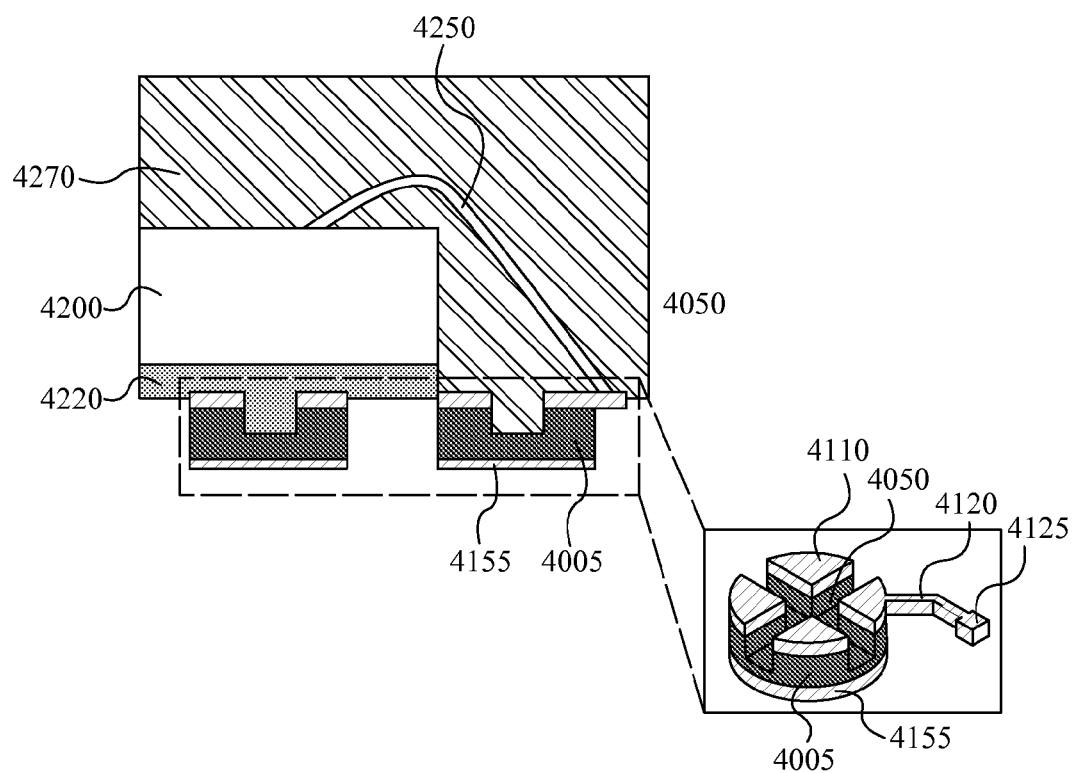
FIG. 31D shows a cross section of a semiconductor package after the etching process.

FIG. 31D shows a cross section of a semiconductor package after the etching process. The die 4200 is mounted on an epoxy 4220 and electrically coupled to an additional contact 4125 by a bondwire 4250. The additional contact 4125 is electrically coupled to the contact point 4110 by a circuit trace 4120. The additional contact 4125, the contact point 4110 and the circuit trace 4120 are all formed by the first plated pattern 4100 of FIG. 27B. After the etching of the metal substrate 4000, only standoffs 4005 remain between the landing pads 4155 and the contact points 4110. When a contact point 4110 is located in an area covered by mold compound 4270, the mold compound 4270 fills in the dimple 4250. When a contact point 4110 is located in an area covered by epoxy 4220, the epoxy 4220 fills in the dimple 4250. What results is a greater contact area between either the epoxy 4220 and a contact point 4110 or the mold compound 4270 and a contact point 4110. Stated differently, the body of the package comprising the mold compound 4270 and the epoxy 4220 has a greater contact area with the contact points 4110. Advantageously, the greater contact area can overcome the force discussed in FIG. 27B, thereby reducing the incidents of peel-away.

Figure 31E:
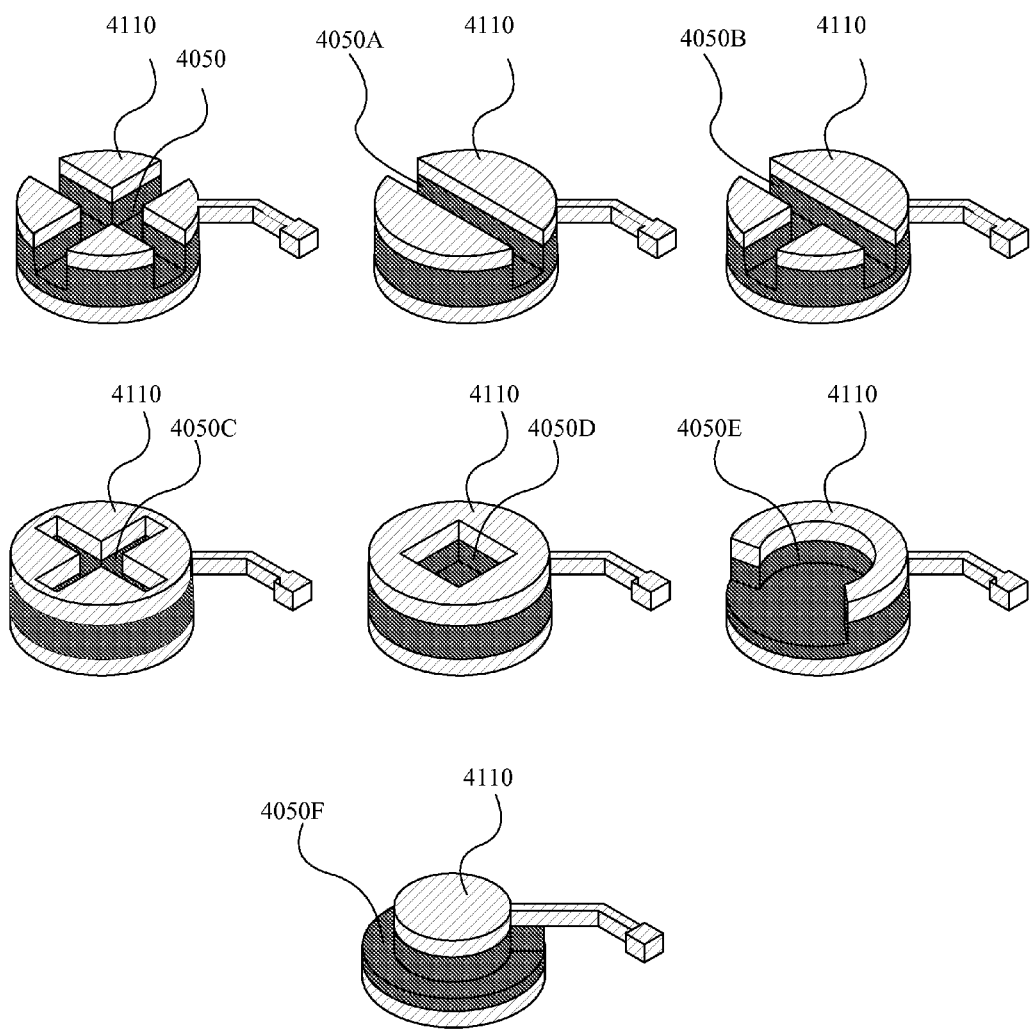
FIG. 31E shows several embodiments of a dimple.

Although generally circular contact points and X shaped dimples have been discussed herein, the person of ordinary skill having the benefit of this disclosure can readily appreciate that many shapes, form factors or designs can be implemented as application requirements dictate. FIG. 31E shows several embodiments of a dimple 4050. Each of these embodiments is merely exemplary. It follows naturally that these shapes and form factors can be combined, in part or in whole, augmented, and modified as applications require. The first exemplary dimple 4050 is an X shape, or cross hatch, that extends to the circumference of the contact point 4110. 4050A and 4050B are variations of 4050 having a single hatch extending to the circumference of the contact point 4110 and a partial cross hatch extending to the circumference of the contact point 4110 respectively. The dimple 4050 does not need to extend to the circumference of the contact point 4110. A cross hatch dimple 4050C is shown completely within the circumference of the contact point 4110. Alternative shapes are contemplated. The dimple 4050D is a square shape that is contained within the circumference of the contact point 4110. The dimple 4050E is a an arcuate shape that is partially circumscribed by the contact point 4110. The inverse is also contemplated, the dimple 4050F partially circumscribes the contact point 4110.

The dimples described in FIGS. 31A-31E are interlocking features for increasing the total contact area between either the mold compound or the adhesive/epoxy of a semiconductor package. The interlocking features described herein are etched into the metal substrate. Alternatively, etching a metal leadframe such that interlocking features protrude therefrom is also contemplated. The interlocking features would protrude into the mold compound and the adhesive/epoxy rather than the mold compound or adhesive/epoxy filling the interlocking features. Furthermore, embodiments without standoffs are contemplated. An etching step can remove the entirety of the metal leadframe leaving only protruding interlocking features, or leave a very thin portion of the metal substrate behind enabling very thin yet highly robust packages.

While the invention has been described with reference to numerous specific details, one of ordinary skill in the art will recognize that the invention can be embodied in other specific forms without departing from the spirit of the invention. Thus, one of ordinary skill in the art will understand that the invention is not to be limited by the foregoing illustrative details, but rather is to be defined by the appended claims.

What is claimed is:

1. A packaged semiconductor device, the device comprising:
   a. a semiconductor die mounted to an adhesive;
   b. a plurality of plated routing traces each having a first contact point and at least one additional contact point,
   c. a plurality of wirebonds for electrically coupling the semiconductor die to the first contact points of the routing traces
   d. a standoff disposed at least some of the additional contact points having plurality of plated layers on a surface opposite from the routing traces, the standoff comprising an interlocking feature formed into the standoff; and
   e. an encapsulant for encapsulating the semiconductor die such that at least a portion of the standoffs are exposed.

2. The device of claim 1 wherein the adhesive fills at least some of the interlocking features.

3. The device of claim 1 wherein the encapsulant fills at least some of the interlocking features.

4. The device of claim 1 wherein the routing traces comprise layers of any among a list of gold, silver, palladium, nickel and any alloy combination thereof.

5. The device of claim 1 wherein a portion of the routing traces are disposed under the semiconductor die.

6. The device of claim 1 wherein the standoff runs a length of the routing trace from the each additional contact point to the first contact point.

7. The device of claim 1 wherein the exposed portions of the standoffs are metallized for solderability preservation.

8. The device of claim 1 further comprising an underfill layer for at least partially encapsulating the exposed portions of the standoffs.

9. The device of claim 1 further comprising solder balls mounted to at least some of the standoffs for increasing a standoff height of the device.

10. The device of claim 1 wherein at least some of the additional contact points comprise support structures.

11. The device of claim 10 wherein the support structures extend outward from the additional contact points.

12. The device of claim 10 wherein the support structures substantially circumscribe the additional contact points.

13. The device of claim 10 wherein the exposed portion of the standoff and second set of plated layers are metallized.

* * * * *

UNITED STATES PATENT AND TRADEMARK OFFICE
CERTIFICATE OF CORRECTION

PATENT NO. : 8,461,694 B1  
APPLICATION NO. : 13/715771  
DATED : June 11, 2013  
INVENTOR(S) : Saravuth Sirinorakul Page 1 of 1

It is certified that error appears in the above-identified patent and that said Letters Patent is hereby corrected as shown below:

Title Page

IN THE "RELATED U.S. APPLICATION DATA" SECTION

Item (60), please insert the phrase --provisional application No. 61/576,326, filed on Dec. 15, 2011-- after the phrase "provisional application No. 61/321,060, filed on Apr. 5, 2010."

Signed and Sealed this  
First Day of October, 2013

Teresa Stanek Rea  
*Deputy Director of the United States Patent and Trademark Office*